US012721145B2

(12) United States Patent
Lin et al.

(10) Patent No.: US 12,721,145 B2
(45) Date of Patent: Aug. 25, 2026

(54) SEMICONDUCTOR DEVICE AND METHOD FOR FORMING THE SAME

(71) Applicant: TAIWAN SEMICONDUCTOR MANUFACTURING COMPANY LTD., Hsinchu (TW)

(72) Inventors: Shu-Cheng Lin, Hsinchu County (TW); Shih Yang Chen, Taoyuan City (TW); Tsung-Yu Chiang, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 417 days.

(21) Appl. No.: 18/348,381

(22) Filed: Jul. 7, 2023

(65) Prior Publication Data

US 2025/0014988 A1 Jan. 9, 2025

(51) Int. Cl.

| | |
|---|---|
| ***H10W 20/42*** | (2026.01) |
| ***H10D 64/01*** | (2025.01) |
| ***H10D 64/23*** | (2025.01) |
| ***H10W 20/00*** | (2026.01) |

(52) U.S. Cl.

CPC ............ *H10W 20/42* (2026.01); *H10D 64/01* (2025.01); *H10D 64/251* (2025.01); *H10W 20/056* (2026.01); *H10W 20/062* (2026.01); *H10W 20/082* (2026.01)

(58) Field of Classification Search

CPC ........... H01L 23/5226; H01L 21/76804; H01L 21/7684; H01L 21/76877; H01L 21/76816; H01L 21/76814; H01L 23/485; H10D 64/01; H10D 64/251; H10D 30/6211; H10W 20/42; H10W 20/056; H10W 20/062; H10W 20/082; H10W 20/089; H10W 20/081; H10W 20/40

See application file for complete search history.

(56) References Cited

U.S. PATENT DOCUMENTS

2016/0079161 A1* 3/2016 Lin .................. H01L 23/53238 438/666

FOREIGN PATENT DOCUMENTS

JP 2008205032 * 9/2008 ......... H01L 23/5226

* cited by examiner

*Primary Examiner* — Thanhha S Pham

(74) *Attorney, Agent, or Firm* — WPAT LAW; Anthony King

(57) ABSTRACT

The present disclosure provides a method for manufacturing a semiconductor device. The method includes: forming a first metal structure in a first ILD layer; planarizing the first metal structure and the first ILD layer, wherein the planarizing generates a groove at an interface of the first metal structure and the first ILD layer; forming an ESL on the first metal structure and the first ILD layer; forming a second ILD layer on the ESL; performing a first etch to remove a portion of the second ILD layer to form a first opening; performing a second etch to remove a portion of the ESL through the opening; performing a third etch to remove a portion of the first ILD layer through the first opening to form a second opening in the first ILD layer; and enlarging the second opening to connected with the groove to form a contact hole.

20 Claims, 29 Drawing Sheets

SEMICONDUCTOR DEVICE AND METHOD FOR FORMING THE SAME

BACKGROUND

In advanced semiconductor technologies, the continuing reduction in device size and increasingly complex circuit arrangements have made the design and fabrication of integrated circuits (ICs) more challenging and costly. To pursue better device performance with smaller footprint and less power, advanced photolithographic technologies, e.g., multiple patterning or extreme ultraviolet (EUV) lithography, has been used to manufacture semiconductor devices with a relatively small critical dimension (CD).

However, when using such technologies, layer-to-layer overlay (OVL) alignments are normally of great importance. Sometimes, the OVL specification is very tight and not every photolithographic operation can generate a photoresist pattern that meets the OVL specification. In such cases, other operations such as additional etch may be performed to compensate for the unsatisfactory OVL.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

DETAILED DESCRIPTION

Figure 1A:
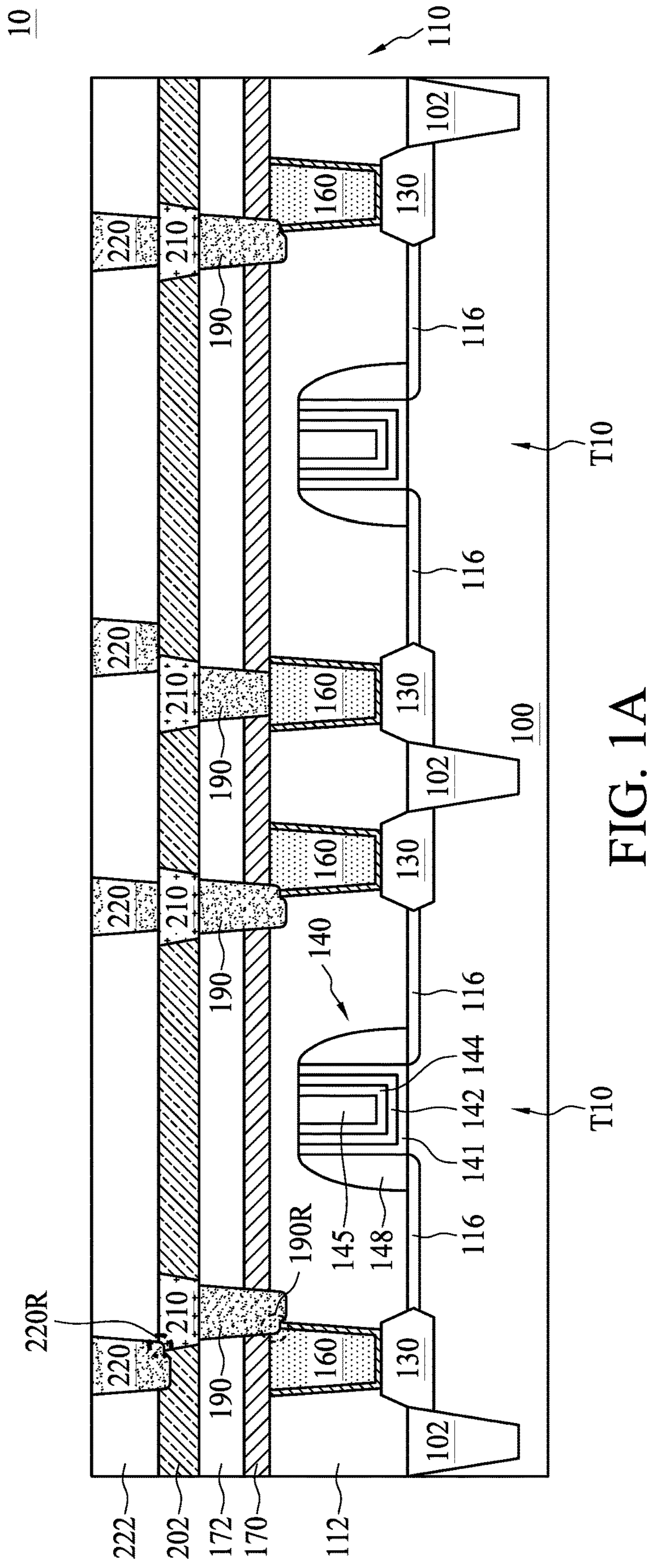
FIG. 1A is a schematic cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on” and the like, can be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as “first,” “second” and “third” describe various elements, components, regions, layers and/or sections, these elements, components, regions, layers and/or sections should not be limited by these terms. These terms may only be used to distinguish one element, component, region, layer or section from another. Terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” and “about” generally mean within a value or range that can be contemplated by people having ordinary skill in the art. Alternatively, the terms “substantially,” “approximately” and “about” mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides a method to solve an issue when a photoresist pattern having an unsatisfactory alignment to a previous layer is used as an etch mask. The present disclosure also provides a semiconductor device formed using such method.

FIG. 1A is a schematic cross-sectional view of a semiconductor device 10. The semiconductor device 10 includes multiple isolation structures 102 disposed in a substrate 100. A device layer 110 is disposed over the substrate 100. Multiple transistors T10 are disposed in the device layer 110. The transistors T10 are surrounded by an inter-layer dielectric (ILD) layer 112 and separated by the isolation structures 102. Each transistor T10 includes a pair of epitaxial features 130 as source/drain regions and a gate structure 140 between the pair of epitaxial features 130 as a corresponding gate region. A lightly doped source/drain (LDD) region 116 is disposed in the substrate 100. The gate structure 140 is surrounded by a gate spacer 148. In some embodiments, the gate structure 140 is a metal gate structure. In such embodiments, the gate structure 140 includes a gate dielectric layer 141, a barrier layer 142 over the gate dielectric layer 141, a work function layer 144 over the barrier layer 142 and a conductive layer 145 over the work function layer 144.

A conductive contact 160 is disposed in the ILD layer 112 and over the epitaxial feature 130. The conductive contact 160 is electrically coupled to the underlying epitaxial feature 130, and further to the transistor T10. An etch stop layer (ESL) 170 is disposed over the conductive contact 160 and the ILD layer 112. An ILD layer 172 is disposed on the ESL 170. A conductive via 190 is disposed in the ILD layer 172. The conductive via 190 is disposed over the conductive contact 160 and the ILD layer 112. The conductive via 190 is attached and electrically coupled to the conductive contact 160 through a corner portion 190R of the conductive via 190. A conductive layer 210 surrounded by an ILD layer 202 is disposed over the conductive via 190 and the ILD layer 172. A conductive layer 220 surrounded by an ILD layer 222 is disposed on the conductive layer 210 and the ILD layer 202. The conductive layer 220 is attached and electrically coupled to the conductive layer 210 through a corner portion 220R of the conductive layer 220.

Figure 1B:
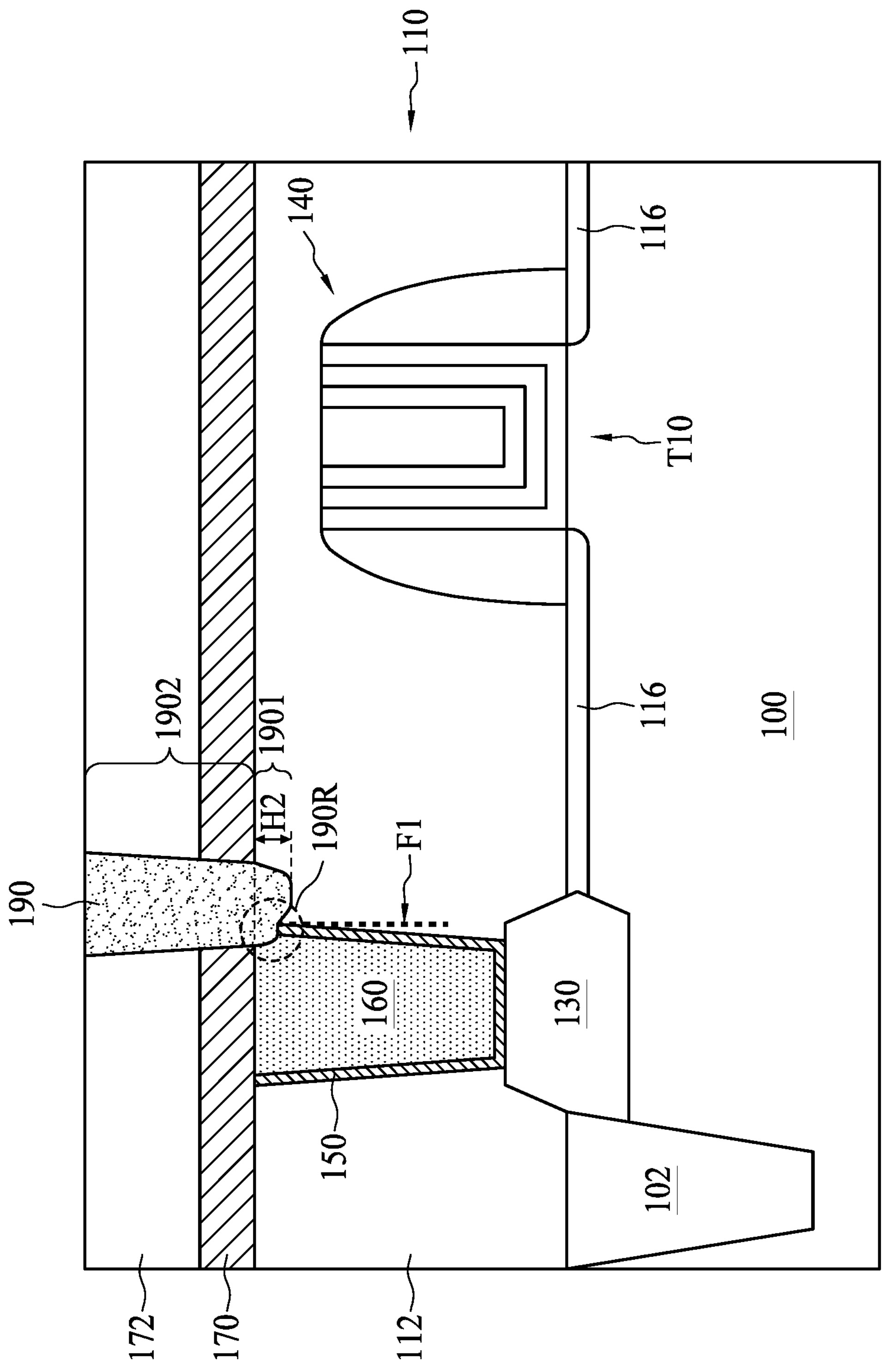
FIG. 1B is an enlarged view of a portion of the semiconductor device in FIG. 1A, in accordance with some embodiments of the present disclosure.

FIG. 1B shows an enlarged view of FIG. 1A and focuses on the conductive contact 160 and the conductive via 190. A diffusion barrier layer 150 is disposed between the ILD layer 112 and the conductive contact 160. The diffusion barrier layer 150 is also disposed on a portion of the epitaxial feature 130. The conductive via 190 is disposed on an interface F1 of the conductive contact 160 and the ILD layer 112. The conductive via 190 penetrates the ILD layer 172 and at least contacts a portion of the diffusion barrier layer 150. In some embodiments, the conductive via 190 is in contact with a top surface of a topmost portion of the diffusion barrier layer 150. Additionally, in such embodiments, the topmost portions of the diffusion barrier layer 150 may be misaligned with each other, as shown in FIG. 1B. The conductive via 190 is surrounded by the ILD layer 112, the ESL 170 and the ILD layer 172. A contacting area between the conductive via 190 and the ILD layer 112 is greater than a contacting area between the conductive via 190 and the conductive contact 160. The conductive via 190 may include a metal different from a metal of the conductive contact 160, but the disclosure is not limited thereto. The conductive via 190 includes a first portion 1901 under a top surface of the ILD layer 112 and a second portion 1902 over the top surface of the ILD layer 112. The first portion 1901 has a height H2 between about 7 nanometers (nm) and about 12 nm, but the disclosure is not limited thereto.

Figure 1C:
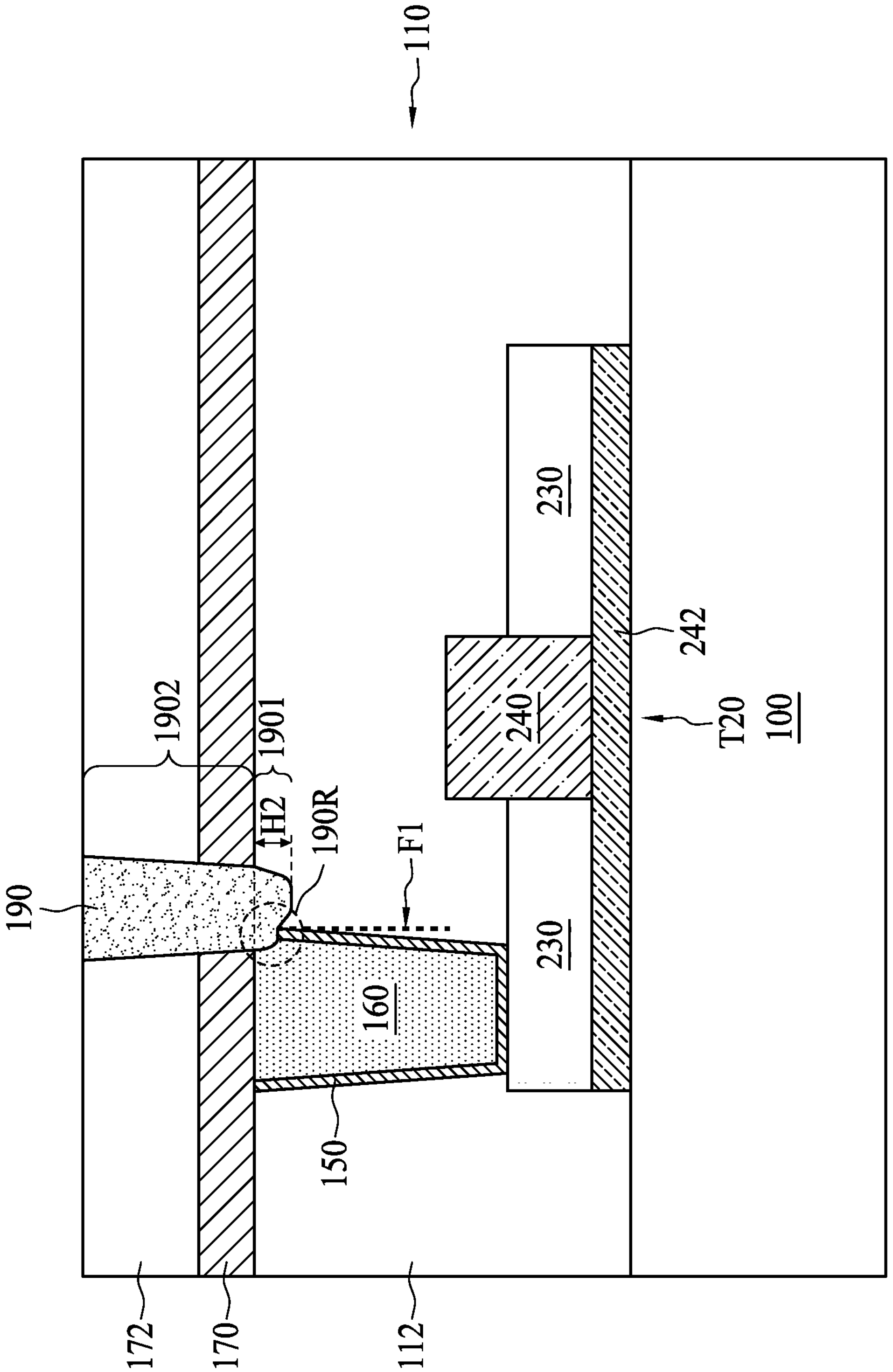
FIG. 1C is another embodiment of FIG. 1B, in accordance with some embodiments of the present disclosure.
Figure 1D:
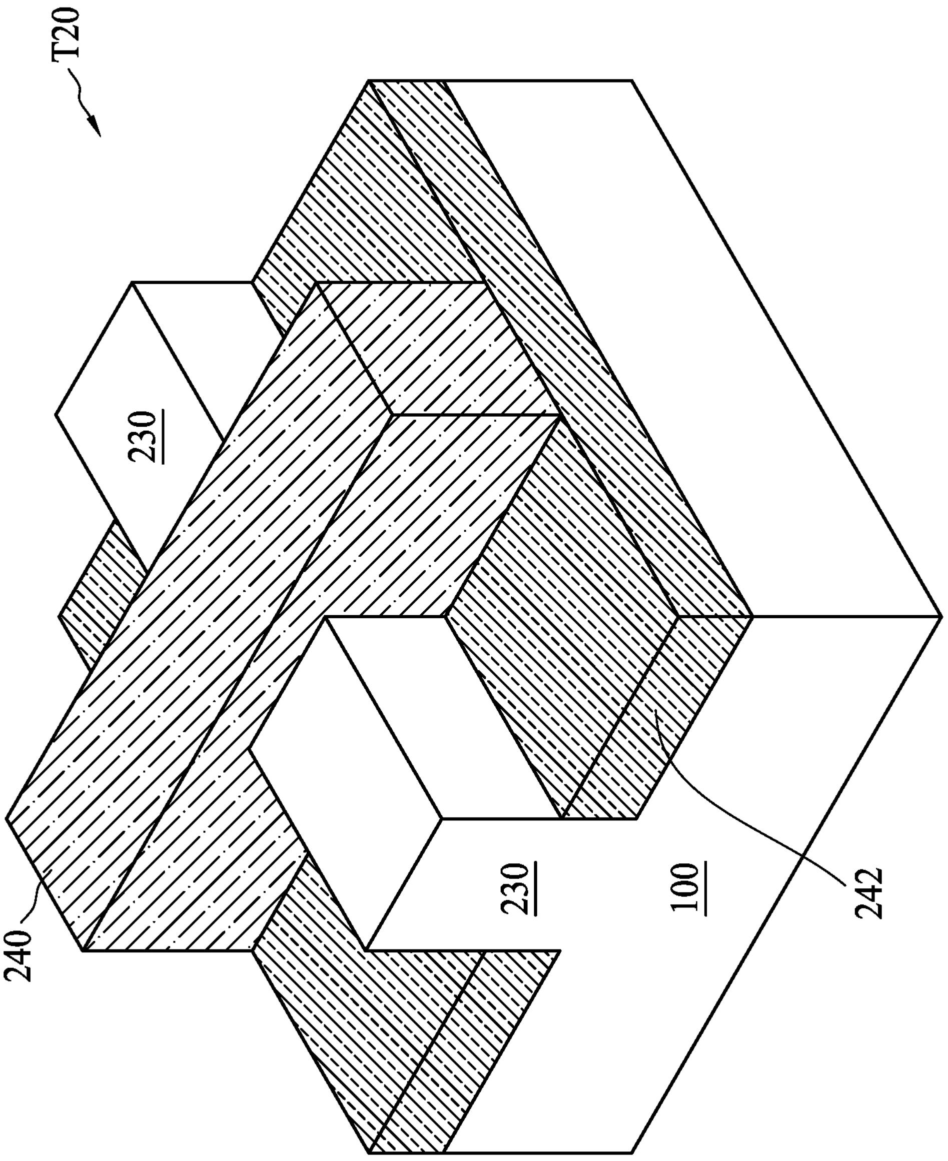
FIG. 1D is an enlarged perspective view of a transistor in FIG. 1C, in accordance with some embodiments of the present disclosure.

FIG. 1C is similar to FIG. 1B while a fin field-effect transistor (FinFET) T20 is in place of the transistor T10. FIG. 1D is an enlarged perspective view of the transistor T20 in FIG. 1C. Referring to FIGS. 1C and 1D, in some embodiments, the substrate 100 includes multiple protruding strips or fins 230. The fins 230 may be parallel to each other. In some embodiments, an isolation layer is disposed on the substrate 100. The isolation layer may completely or partially cover the substrate 100. In some embodiments, the isolation layer is separated by the fins 230 to form multiple isolation structures 242. The isolation layer may be formed of oxide. In some embodiments, the isolation structures 242 form shallow trench isolation (STI) regions. In some embodiments, a gate stack 240 is disposed on the isolation structures 242 and between two fins 230. The gate stack 240 may include a gate dielectric and a gate electrode on the gate dielectric. In some embodiments, a top surface of the gate stack 240 is higher than top surfaces of the fins 230. A pair of the fins 230 separated by the gate stack 240 may form the transistor T20. The pair of the fins 230 may function as source/drain regions of the gate stack 240. The conductive contact 160 may be disposed on and electrically coupled to one of the fins 230 shown in FIG. 1C. Another conductive contact (not shown) may be disposed on and electrically coupled to the other of the fins 230.

Figure 2:
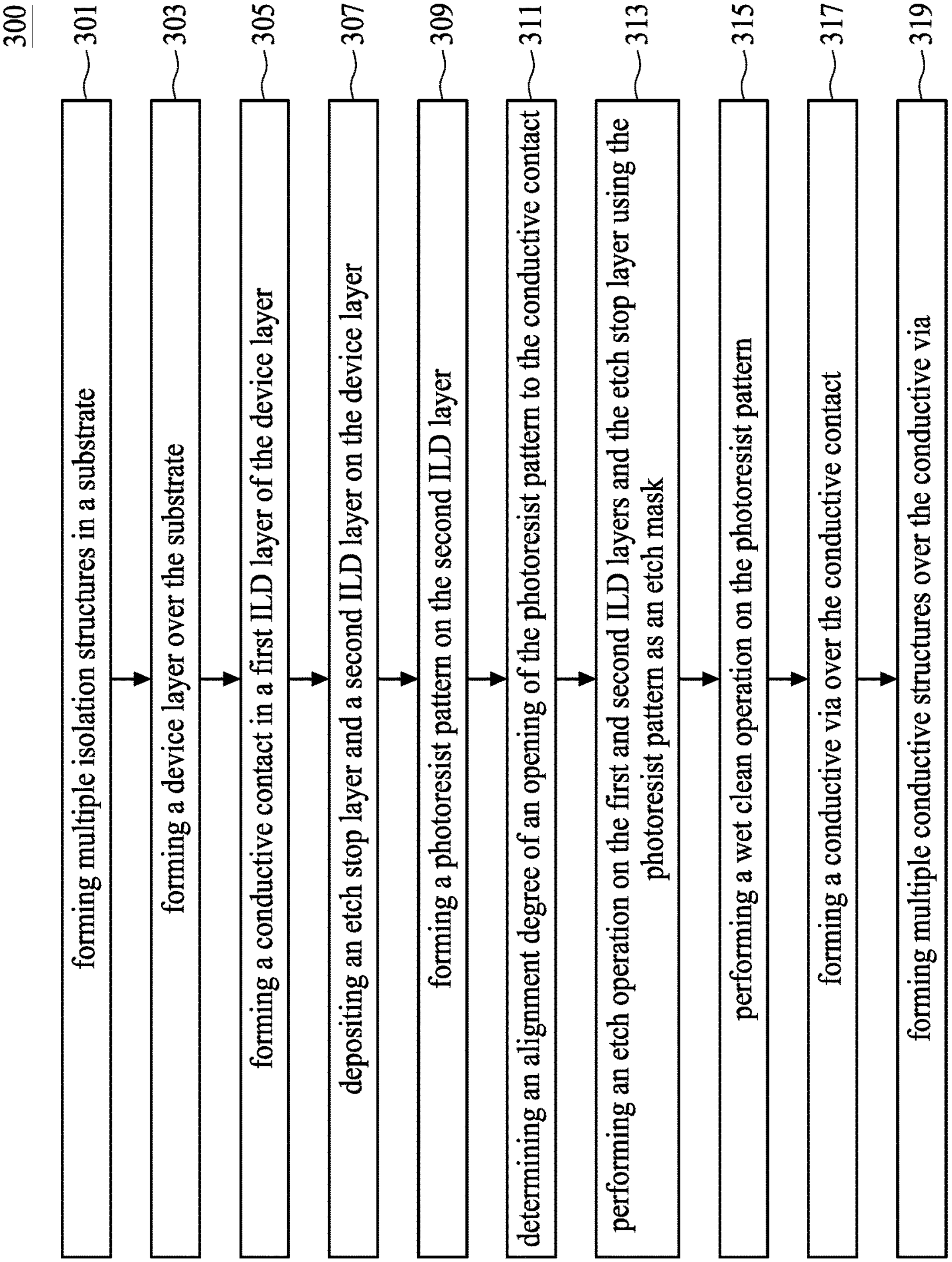
FIG. 2 is a flow diagram showing a method of fabricating a semiconductor device shown in FIGS. 1A and 1B, in accordance with some embodiments of the present disclosure.

FIG. 2 is a flow diagram showing a method 300 of fabricating the semiconductor device 10 in FIGS. 1A and 1B. FIGS. 3 to 19 are schematic cross-sectional views illustrating sequential operations of the method 300 shown in FIG. 2. The method 300 includes several operations (301, 303, 305, 307, 309, 311, 313, 315, 317 and 319) and the description and illustration are not deemed as a limitation to the sequence of the operations.

Figure 3:
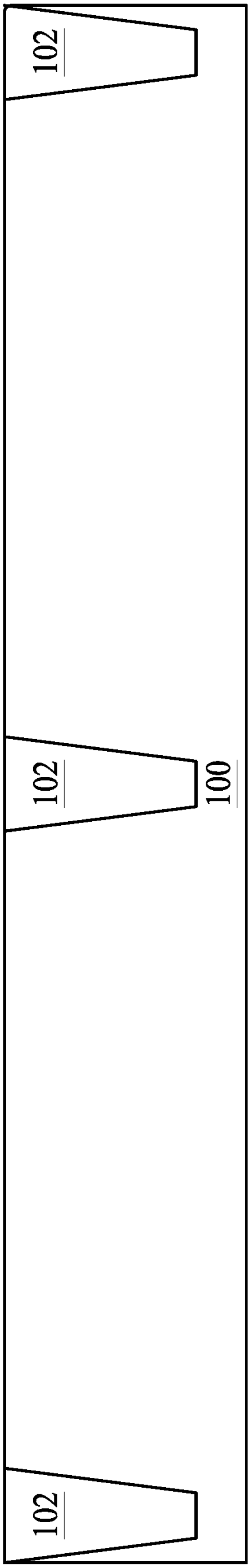
FIGS. 3 to 19 are schematic cross-sectional views illustrating sequential operations of the method shown in FIG. 2, in accordance with some embodiments of the present disclosure.

In operation 301 of FIG. 2, multiple isolation structures 102 are formed in a substrate 100, as shown in FIG. 3. The substrate 100 may be a semiconductor substrate such as a bulk silicon wafer. In some embodiments, the substrate 100 is a semiconductor-on-insulator (SOI) substrate, a multi-layered or gradient substrate, or the like. The substrate 100 may include a semiconductor material such as Si, Ge, a compound or alloy semiconductor including SiC, SiGe, GaAs, GaP, GaAsP, AlInAs, AlGaAs, GaInAs, InAs, GaInP, InP, InSb, GaInAsP, or a combination thereof. The substrate 100 may be doped or undoped.

The isolation structures 102 may be shallow trench isolation (STI) regions. Although not specifically illustrated, the isolation structures 102 may be formed using a series of lithographic, etching, deposition and/or planarization operations. For example, multiple trenches may be formed in the substrate 100 using an etching operation such as reactive ion etching (RIE), dry etching, or a combination thereof. Subsequently, an insulating material is deposited to fill the trenches. The insulating material may be silicon oxide, silicon nitride, or a combination thereof. The insulating material may be deposited using chemical vapor deposition (CVD), atmospheric pressure CVD (APCVD), high density plasma CVD (HDP-CVD), or other suitable methods. A planarization operation, such as a chemical mechanical polishing (CMP) operation, may be used to remove any excess insulating material over the top surface of the substrate 100. As a result, the formation of the isolation structures 102 is complete.

Appropriate wells (not shown) may be formed in the substrate 100 and separated by the isolation structures 102. The isolation structures 102 may be used to define one or more transistor regions in or over the substrate 100. In some embodiments, a P-well is formed in the substrate 100 where an N-type device, such as an N-type FET, is to be formed. In some embodiments, an N-well is formed in the substrate 100 where a P-type device, such as a P-type FET, is to be formed. In some embodiments, both a P-well and an N-well are formed in the substrate 100. The wells may be formed using an ion-implantation operation. P-type dopants such as boron (B), gallium (Ga) and indium (In), or N-type dopants such as phosphorous (P) and arsenide (As), may be implanted into selected regions of the substrate 100.

Figure 4:
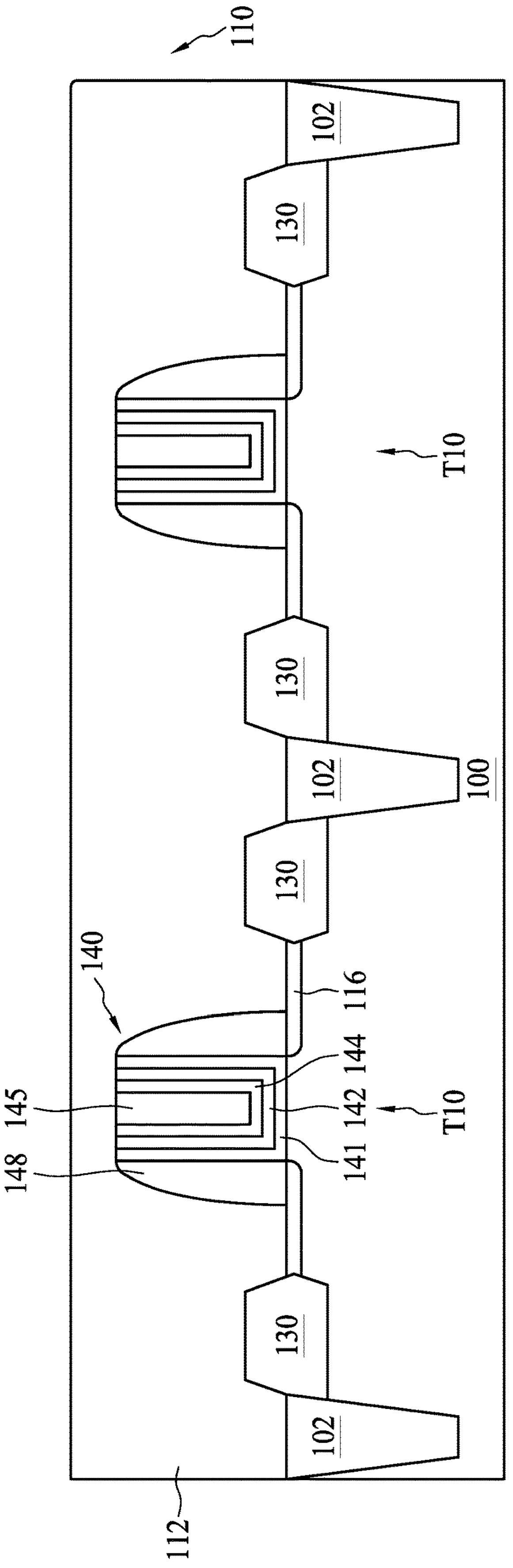

In operation 303 of FIG. 2, a device layer 110 is formed over the substrate 100, as shown in FIG. 4. The device layer 110 is formed in a front-end-of-line (FEOL) stage during the formation of the semiconductor device 10. Multiple transistors T10 are formed in the device layer 110. An interlayer dielectric (ILD) layer 112 is formed on the substrate 100 using spin-on coating, CVD, and/or other suitable methods. The ILD layer 112 may be made of silicon oxide, silicon nitride, undoped silicate glass (USG), phospho-silicate glass (PSG), boro-silicate glass (BSG), boron-doped phospho-silicate glass (BPSG), tetraethyl orthosilicate (TEOS), or other suitable materials. In some embodiments, the ILD layer 112 includes an extreme low-k (ELK) dielectric material, which has a dielectric constant between 2.0 and 3.0.

The transistors T10 are formed in the ILD layer 112 and separated by the isolation structures 102. The transistors T10 may be complementary metal-oxide-semiconductor (CMOS) device. In some embodiments, the transistors T10 are planar transistors. In some other embodiments, other types of transistors such as FinFETs, gate-all-around (GAA) transistors, nanosheet transistors, and the like are in place of the transistors T10. The transistors T10 shown in FIG. 4 and following figures are just exemplary examples. There is no limitation on the type of the transistors T10. Although not specifically illustrated, the transistors T10 may be formed using a series of lithographic, etching, epitaxial, implantation, deposition, and/or planarization operations.

Each transistor T10 includes a pair of epitaxial features 130 and a gate structure 140 between the pair of epitaxial features 130. The epitaxial features 130 may be formed using metal-organic chemical vapor deposition (MOCVD), selective epitaxial growth (SEG), molecular-beam epitaxy (MBE), vapor-phase epitaxy (VPE), liquid-phase epitaxy (LPE), and/or other suitable methods. The formation of the epitaxial features 130 may include doping with N-type or P-type dopants, which cause the epitaxial features 130 to be conductive. The epitaxial features 130 may have a profile of triangular, trapezoidal, pentagonal, or hexagonal, depending on their formation method.

The gate structure 140 may be formed using a "replacement polysilicon gate (RPG)" method. For example, first, a dummy gate structure surrounded by a gate spacer 148 may be formed on the substrate 100. The gate spacer 148 may be made of silicon nitride, silicon carbon nitride, a combination thereof, or the like. Prior to the formation of the gate spacer 148, a lightly doped source/drain (LDD) region 116 may be formed in the substrate 100. The LDD region 116 may be formed by an ion-implantation operation. The LDD region 116 may include P-type dopants or N-type dopants depending on a P-type device or an N-type device is to be formed. The abovementioned epitaxial features 130 and the ILD layer 122 are then formed over the substrate 100. Subsequently, the dummy gate structure is removed and replaced by the gate structure 140 shown in FIG. 4. The gate structure 140 may include a gate dielectric layer 141, a barrier layer 142, a work function layer 144 and a conductive layer 145.

The gate dielectric layer 141 may be formed using atomic layer deposition (ALD), CVD or other suitable methods. The gate dielectric layer 141 may include a high-dielectric constant (high-k) dielectric material. For example, the gate dielectric layer 141 may have a dielectric constant greater than about 7.0 and may include a metal oxide or a silicate of Hf, Al, Zr, La, Mg, Ba, Ti, Pb, or a combination thereof. The gate dielectric layer 141 may include $HfO_2$, HfSiO, HfSiON, HfTaO, HfTiO, HfZrO, other suitable high-k dielectric materials. Prior to the formation of the gate dielectric layer 141, an interfacial dielectric layer can be formed on the substrate 100. The interfacial dielectric layer may be, for example, an oxide formed by thermal oxidation, chemical oxidation, ALD or another suitable method. The gate dielectric layer 141 may be surrounded by the LDD region 116. The gate dielectric layer 141 may cover inner sidewalls of the gate spacer 148 and a portion of the substrate 100.

The barrier layer 142 may be conformally formed on the gate dielectric layer 141 using ALD, CVD or other suitable methods. The barrier layer 142 may include a single layer or multiple sub-layers. The barrier layer 142 may include titanium nitride (TiN), tantalum nitride (TaN), the like, or a combination thereof. The barrier layer 142 may be used to prevent a subsequently deposited metal-containing material from diffusing into the gate dielectric layer 141.

Figure 5:
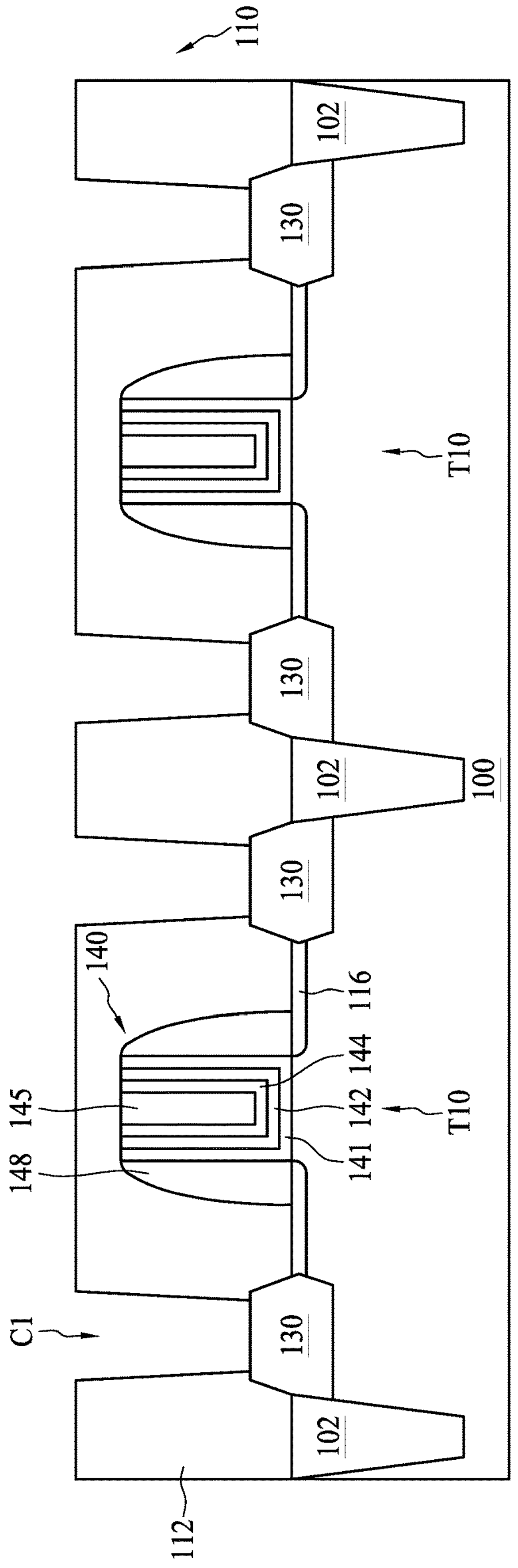

The work function layer 144 may be conformally formed on the barrier layer 142 using ALD, CVD or other suitable methods. The work function layer 144 may include a single layer or multiple sub-layers. For forming the work function layer 144, a gate material having a work function that can place its Fermi level close to the middle of the band gap of silicon is required. In order to tailor a threshold voltage (Vth) of the gate structure 140 that is to be formed, the gate material for forming the gate structure 140 should have a tunable work function. The work function layer 144 may be a suitable material used to tune a work function of the gate structure 140 to a desired level. The work function layer 144 may include TiN, TaN, tungsten nitride (WN), the like, or a combination thereof. In some embodiments, the gate dielectric layer 141, the barrier layer 142 and the work function layer 144 have a U-shaped profile, as shown in FIG. 5. In some other embodiments, the gate dielectric layer 141, the barrier layer 142 and the work function layer 144 have a flat profile.

The conductive layer 145 may be conformally formed on the work function layer 144 using physical vapor deposition (PVD), sputtering, electroplating, ALD or other suitable methods. The conductive layer 145 may include one or more conductive materials, such as W, Cu, Co, Al, Ni, Ta, Ti, Mo, Pd, Pt, Ru, Ir, Ag, Au, TiN, TaN, the like, or a combination thereof. A planarization operation, such as CMP, may be used to remove portions of the conductive layer 145, the work function layer 144, the barrier layer 142 and the gate dielectric layer 141 such that top surfaces of the conductive layer 145, the work function layer 144, the barrier layer 142 and the gate dielectric layer 141 may be substantially coplanar.

The gate structure 140 is surrounded by the gate spacer 148. The conductive layer 145 may function a gate electrode of the gate structure 140. In each transistor T10, a pair of epitaxial features 130 may serve as a source/drain region corresponding to a gate structure 140 between the pair of epitaxial features 130. A channel region (not shown) may be in the substrate 100 and between a pair of LDD regions 116. A silicide layer (not shown), such as cobalt-silicide (CoSi), nickel silicide (NiSi) or tungsten silicide (WSi), may be formed on a top surface of each epitaxial feature 130. The silicide layer may be used to increase compatibility between a material of the epitaxial feature 130 and a material of a conductive contact subsequently formed on the epitaxial feature 130. In addition, the silicide layer can reduce parasitic resistance or sheet resistance at a silicon/metal contact junction.

In operation 305 of FIG. 2, a conductive contact 160 is formed in the ILD layer 112 of the device layer 110, as shown in FIGS. 5 to 8. Referring to FIG. 5, multiple contact holes C1 are formed in the ILD layer 112. The contact hole C1 may expose the underlying epitaxial feature 130.

Figure 6:
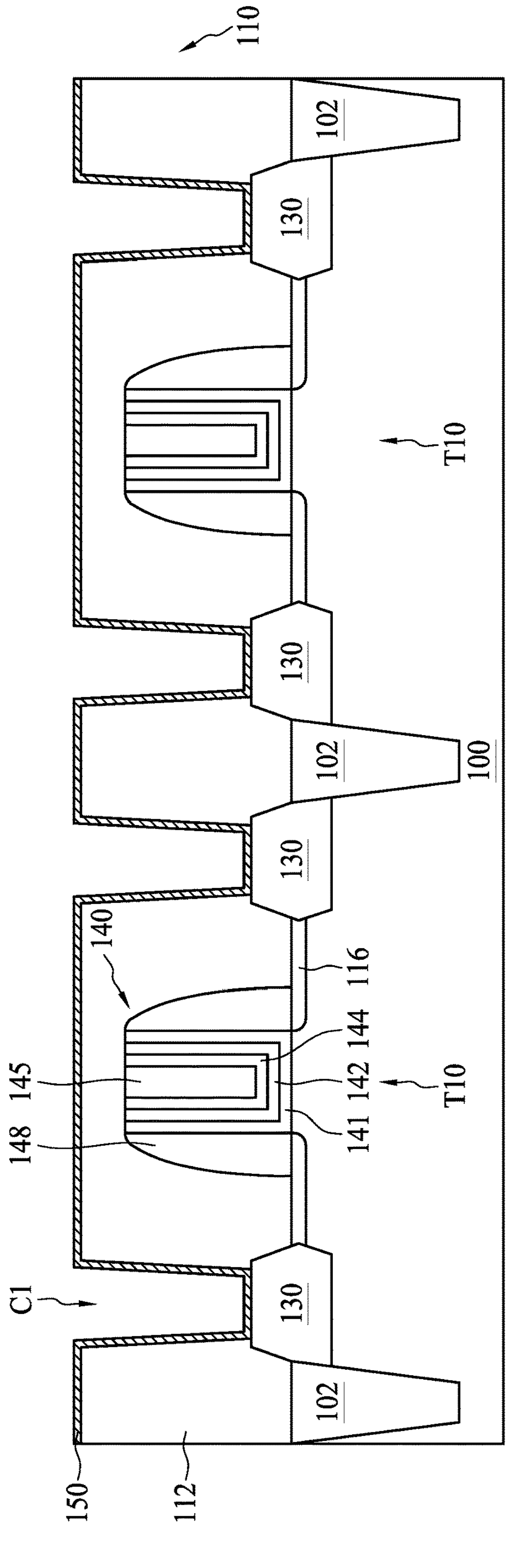

Referring to FIG. 6, a diffusion barrier layer 150 may be formed over the ILD layer 112, conformally along sidewalls of the contact holes C1 and on the exposed portions of the epitaxial features 130 using ALD or other suitable methods. The diffusion barrier layer 150 may include TiN, TaN, Ta, Ti, TiSN, TaSN, W, WN, or combinations thereof. The diffusion barrier layer 150 may be used to prevent a metal species of a subsequently deposited conductive material from diffusing into the ILD layer 112.

Figure 7:
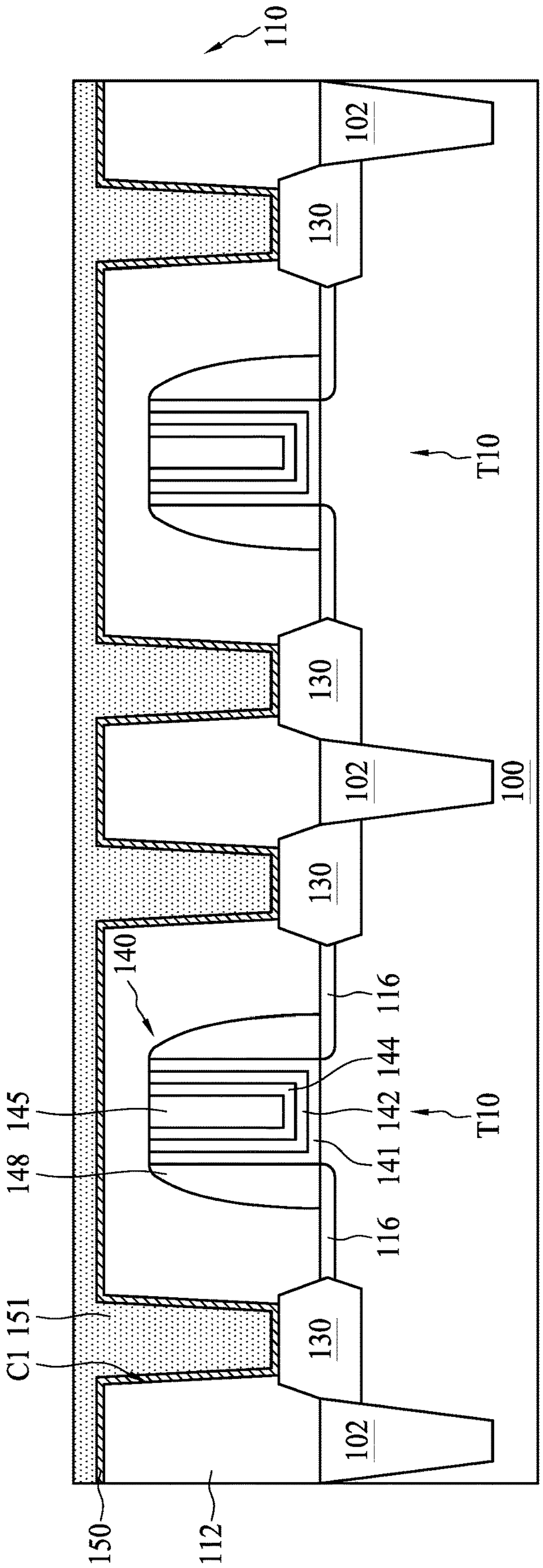

Referring to FIG. 7, a conductive material 151, such as W, Cu, Co, Al, Ni, Ta, Ti, Mo, Pd, Pt, Ru, Ir, Ag, Au, the like, or a combination thereof, may be deposited into the contact holes C1 using sputtering, electroplating, PVD or other suitable methods. Accordingly, the contact holes C1 are filled with the conductive material 151. The conductive material 151 may completely cover the ILD layer 112 and the diffusion barrier layer 150.

Figure 8:
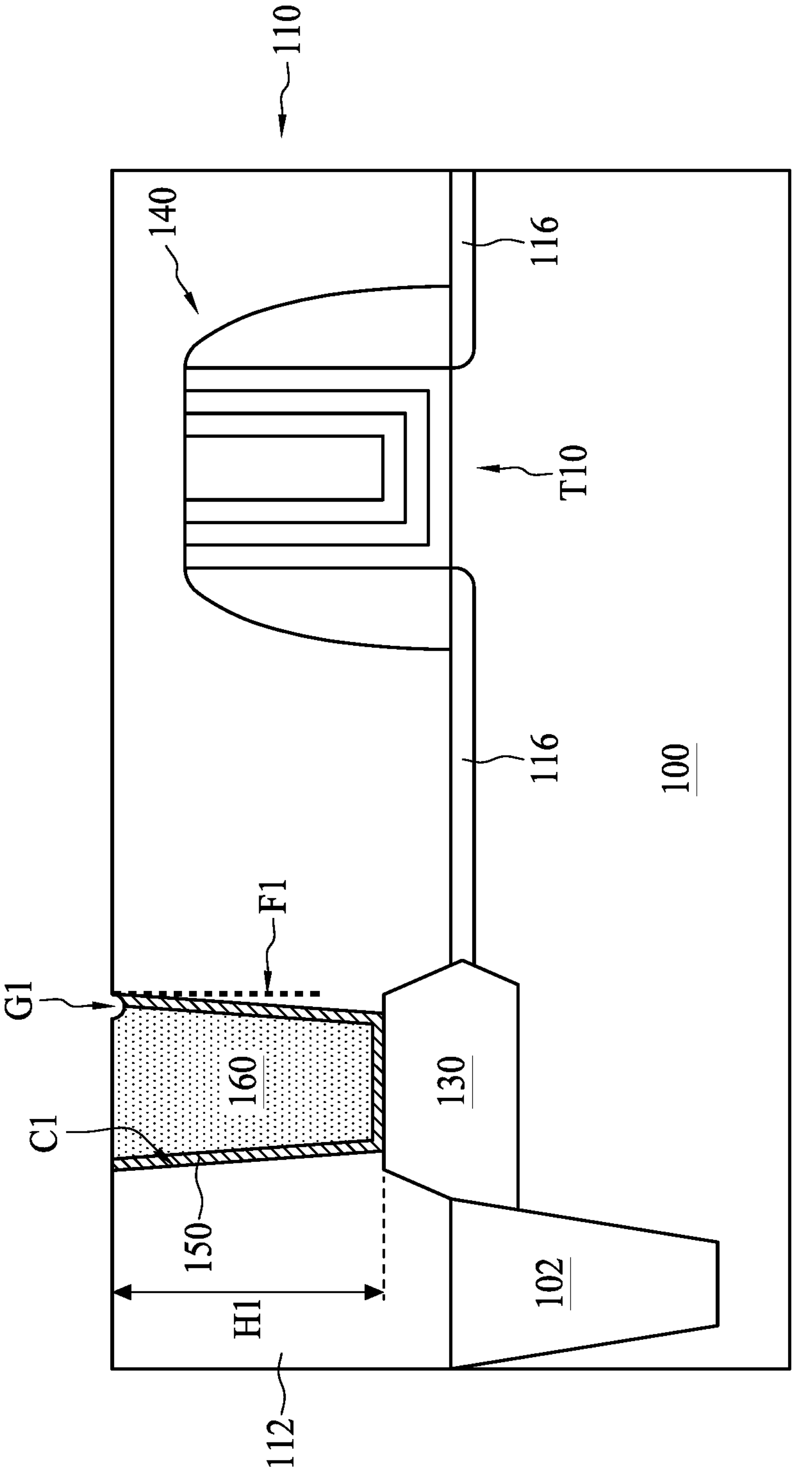

Referring to FIG. 8, which is an enlarged view continued from FIG. 7, a planarization operation, such as CMP, may be used to remove any excess conductive material 151 over a top surface of the ILD layer 112. The conductive material in the contact hole C1 and the ILD layer 112 are planarized to have a coplanar top surface. Portions of the diffusion barrier layer 150 over the top surface of the ILD layer 112 may also be removed at the same time. The remained conductive material in the contact hole C1 forms the conductive contact 160. The conductive contact 160 may have a predetermined height H1. The conductive contact 160 may be a metal layer surrounded by the ILD layer 112. The conductive material of the conductive contact 160 and the dielectric material of the ILD layer 112 may have different physical resistances to the planarization operation. In some embodiments, the planarization operation generates a groove G1 at an interface F1 of the conductive contact 160 and the ILD layer 112. The groove G1 may be formed due to a small loss of the conductive contact 160 and/or the diffusion barrier layer 150.

Figure 9:
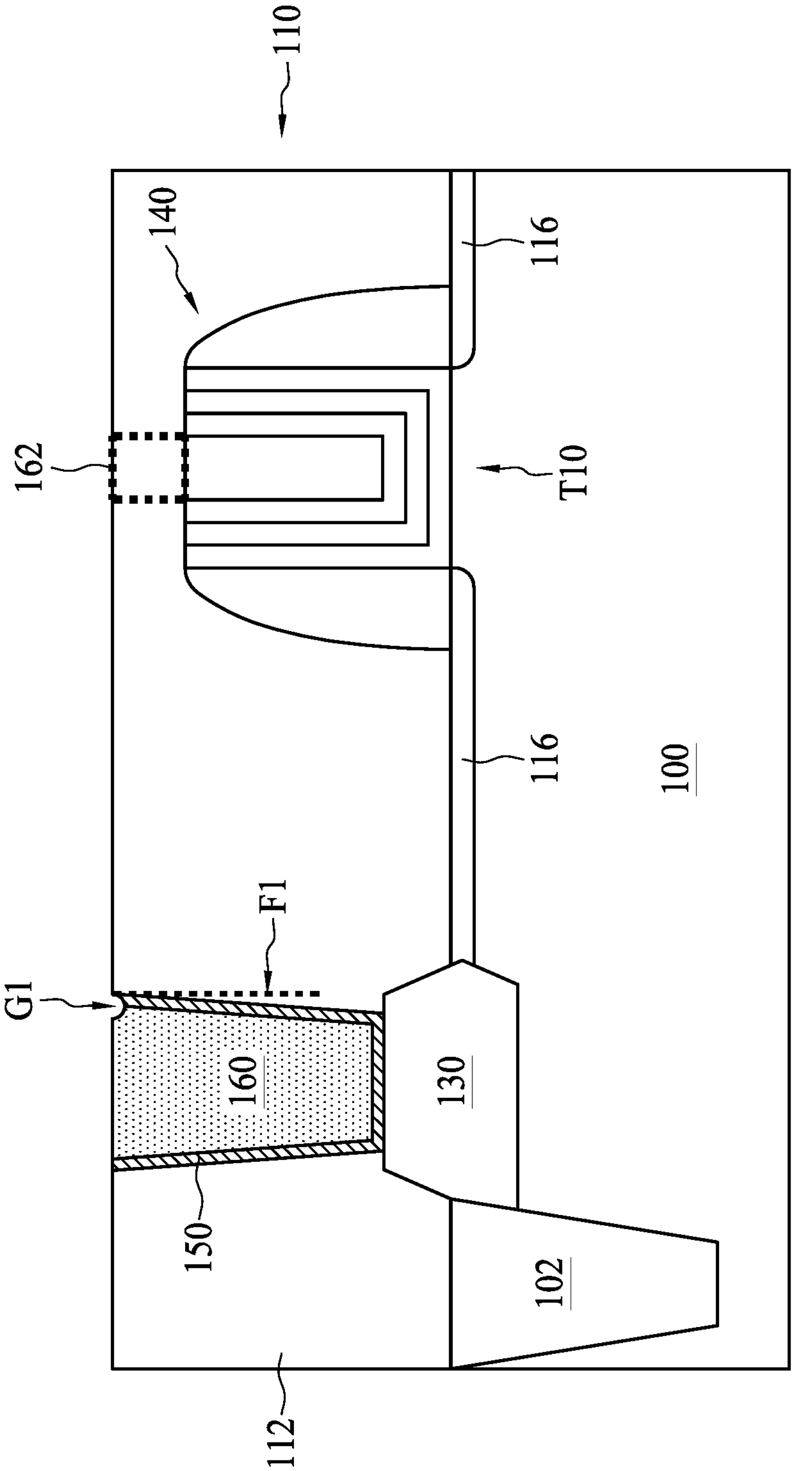

Referring to FIG. 9, although not specifically illustrated, a conductive contact 162 may be formed over the gate structure 140. The conductive contact 162 may be formed using a similar method to the method for forming the conductive contact 160. The conductive contacts 160 and 162 may be simultaneously or separately formed. The order for forming the conductive contacts 160 and 162 is not limited. In some embodiments, the conductive contact 160 is electrically coupled to the epitaxial feature 130 (i.e., the source or drain region), and the conductive contact 162 is electrically coupled to the gate structure 140. The conductive contact 160 may be referred to herein as an S/D contact or a metal-to-drain (MD) feature that is used to connect the S/D region in the substrate 100 to a conductive layer overlying the S/D region. The conductive contact 162 may be referred to herein as a metal-to-gate (MG) feature that is used to connect the gate structure 140 to a conductive layer overlying the gate structure 140.

Figure 10:
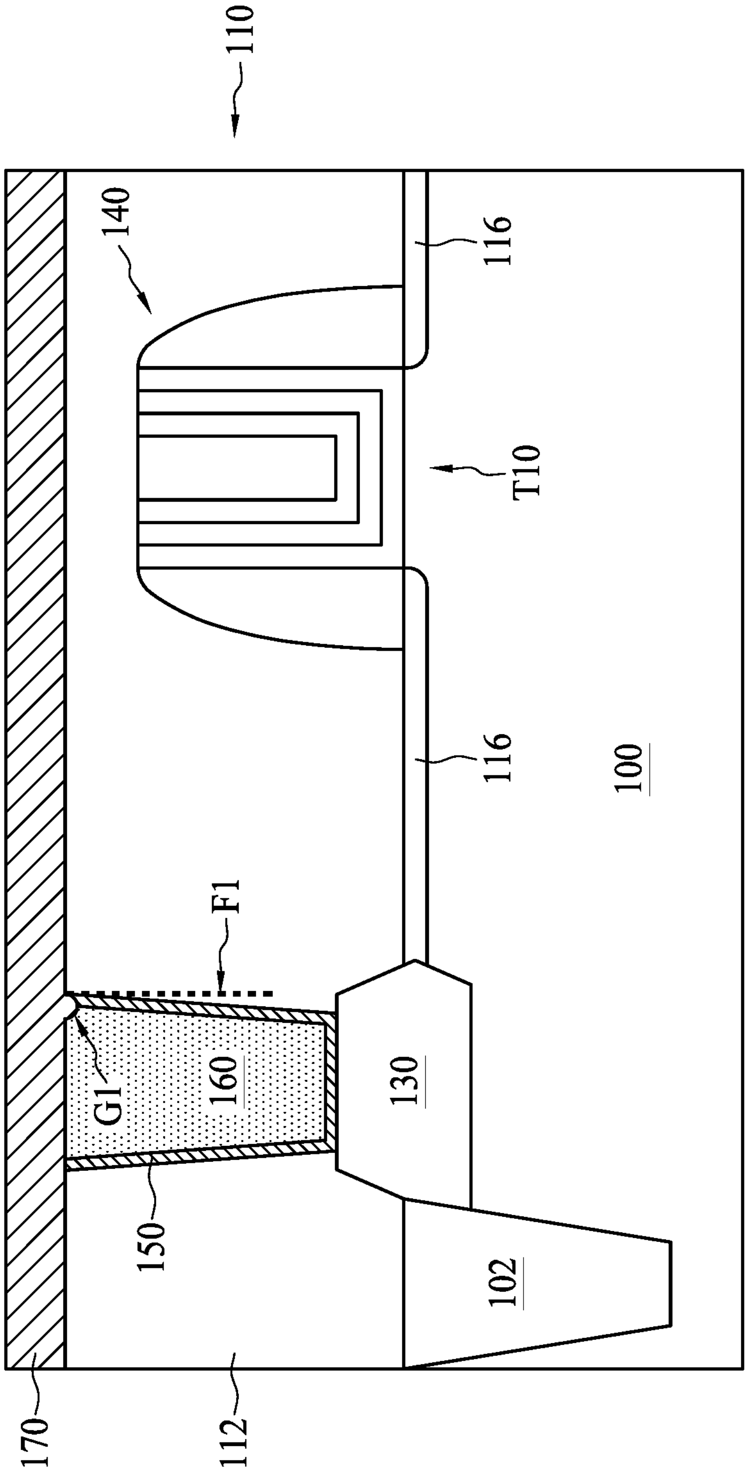
Figure 11:
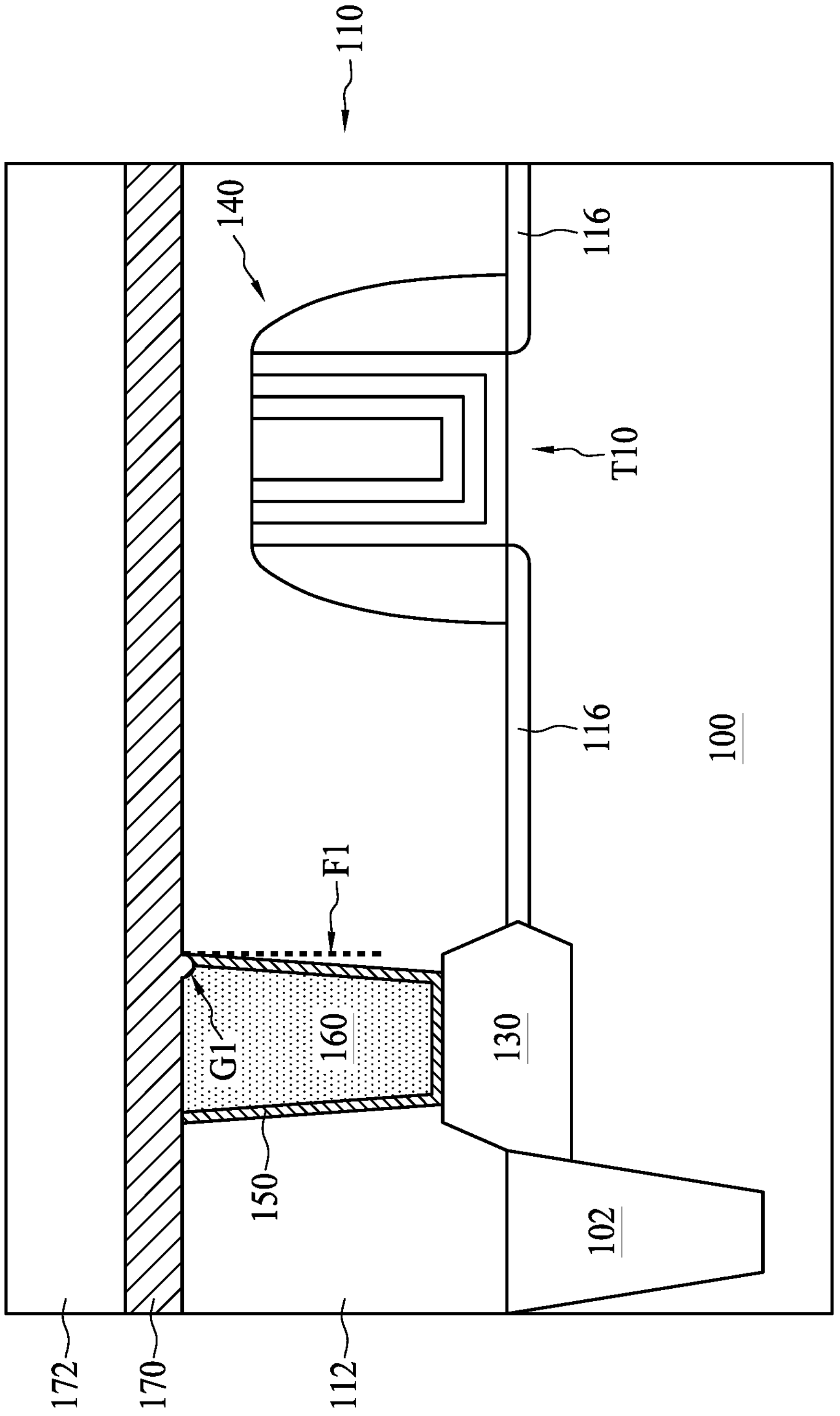

In operation 307 of FIG. 2, an etch stop layer (ESL) 170 and an ILD layer 172 are deposited on the device layer 110, as shown in FIGS. 10 and 11. Referring to FIG. 10, a material such as silicon nitride is deposited on the ILD layer 112, the conductive contact 160 and the diffusion barrier layer 150, thus forming the ESL 170. The ESL 170 may fill the groove G1 at this stage. Referring to FIG. 11, a dielectric material the same as or similar to the material of the ILD 112 is deposited on the ESL 170, thus forming the ILD layer 172. In some embodiments, the ILD layer 172 may be referred to as an inter-metal dielectric (IMD) layer. In some embodiments, the ESL 170 and the ILD layer 172 have different etch characteristics (for example, etch rates). In some embodiments, the ILD layer 172 and the ILD 112 substantially have the same etch characteristic.

Figure 12:
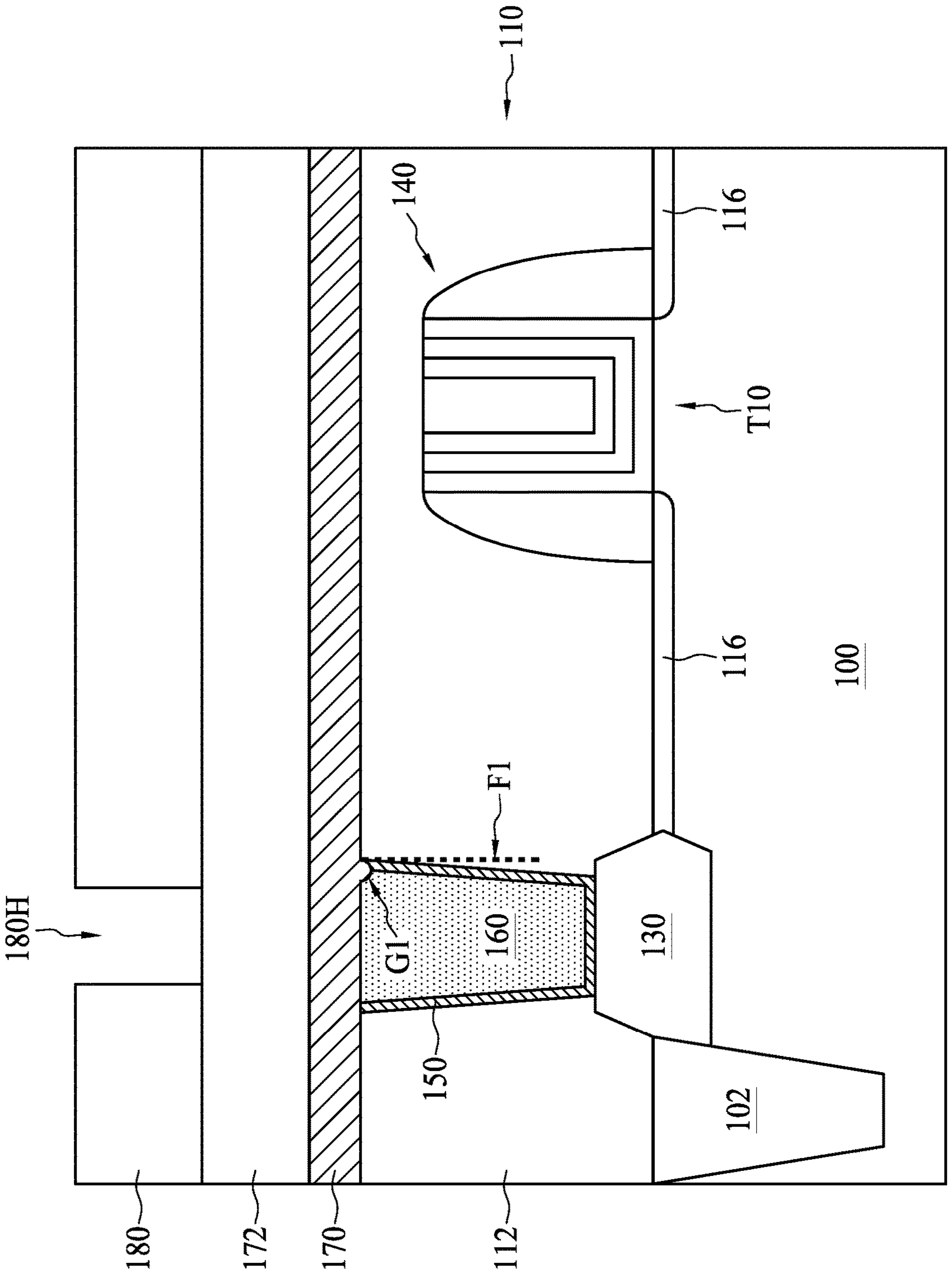

In operation 309 of FIG. 2, a photoresist pattern 180 is formed on the ILD layer 172, as shown in FIG. 12. To form the photoresist pattern 180, a photoresist layer is coated over the ILD layer 172, followed by exposing the photoresist layer to a radiation such as deep ultraviolet (DUV) or extreme ultraviolet (EUV) through a photomask. After development, the exposed photoresist layer is removed, thus forming the photoresist pattern 180. The photoresist pattern 188 includes one or more openings 180H that may expose portions of a top surface of the underlying ILD layer 172.

Figure 13A:
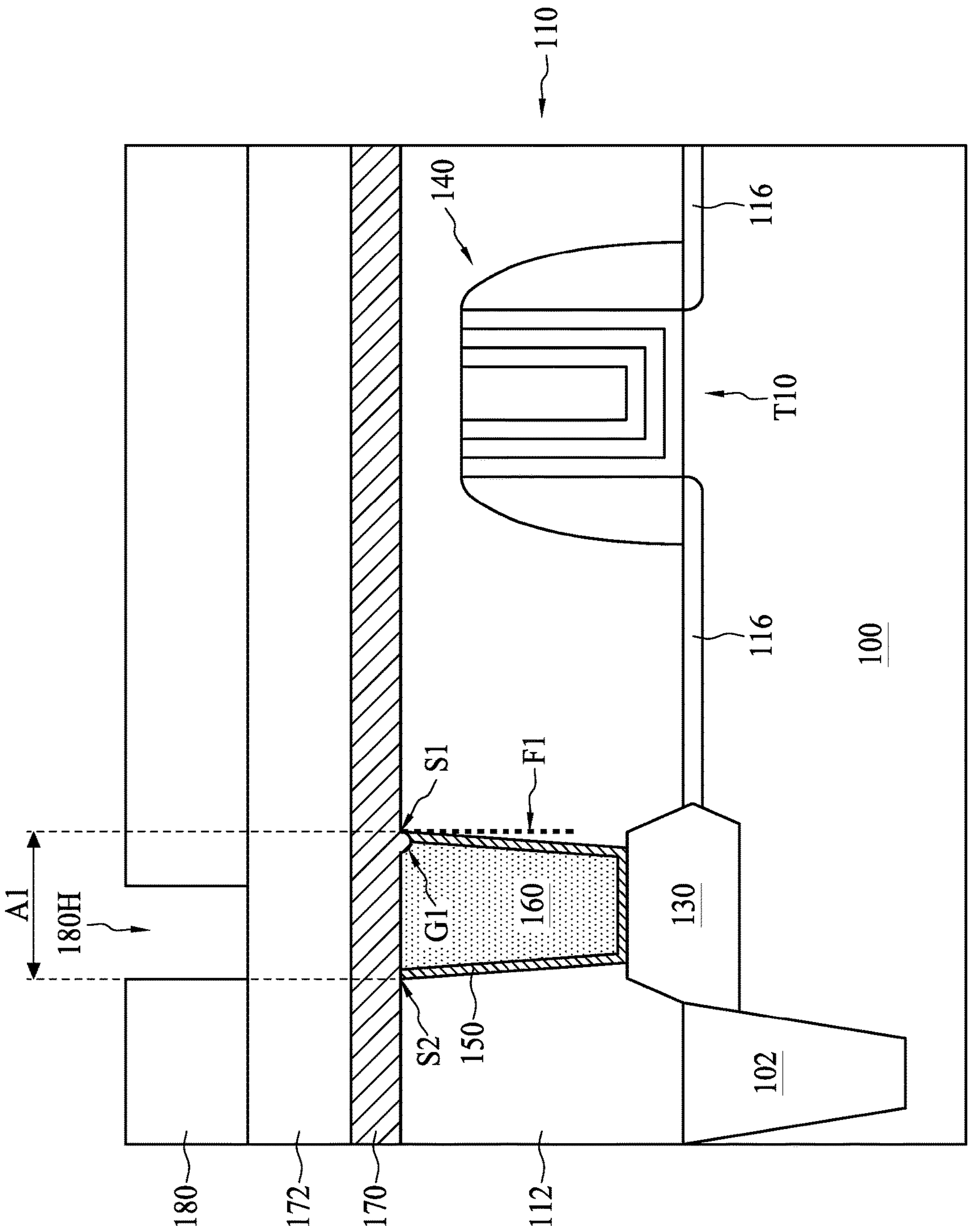
Figure 13B:
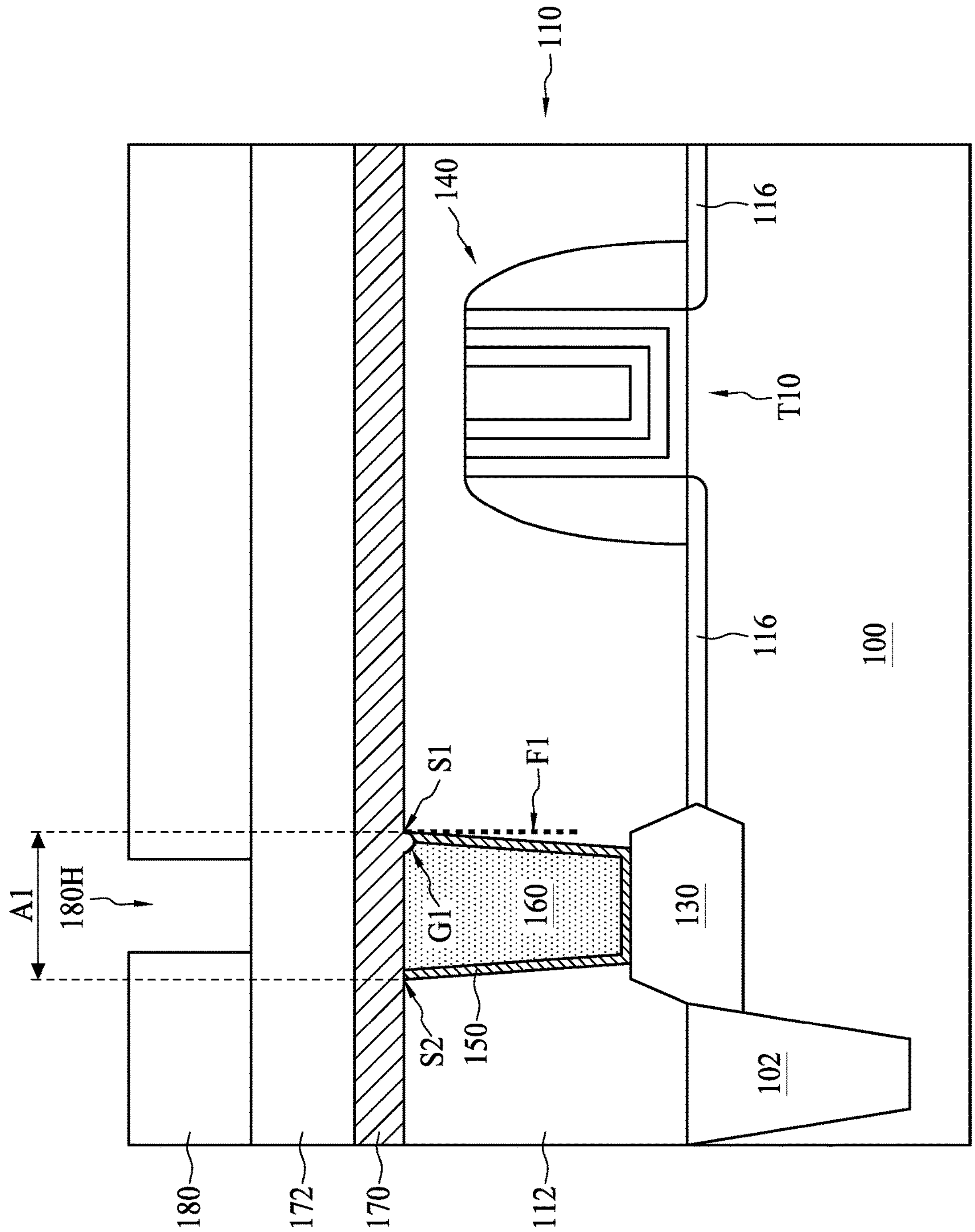
Figure 13C:
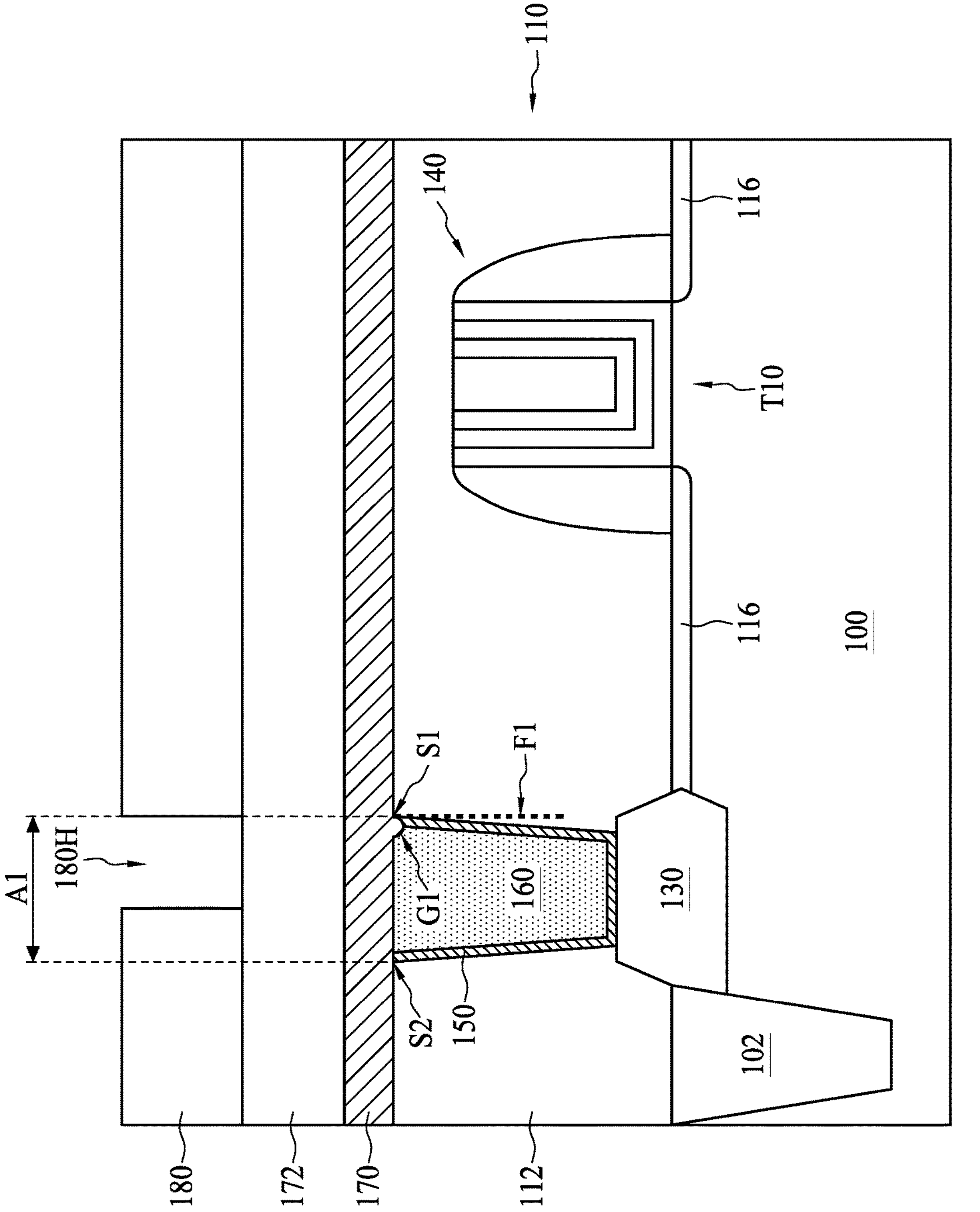

In operation 311 of FIG. 2, an alignment degree of the opening 180H of the photoresist pattern 180 to the conductive contact 160 is determined, as shown in FIGS. 13A to 13D. Such determination may be executed using an overlay (OVL) measurement. Referring to FIG. 13A, an alignment range A1 may be defined by a pair of vertical extensions of two top edge S1 and S2 of the conductive contact 160. If the opening 180H is within the alignment range A1, as shown in FIGS. 13A to 13C, then a routine etch operation may be performed on the ILD layer 172 and the ESL 170.

Figure 13D:
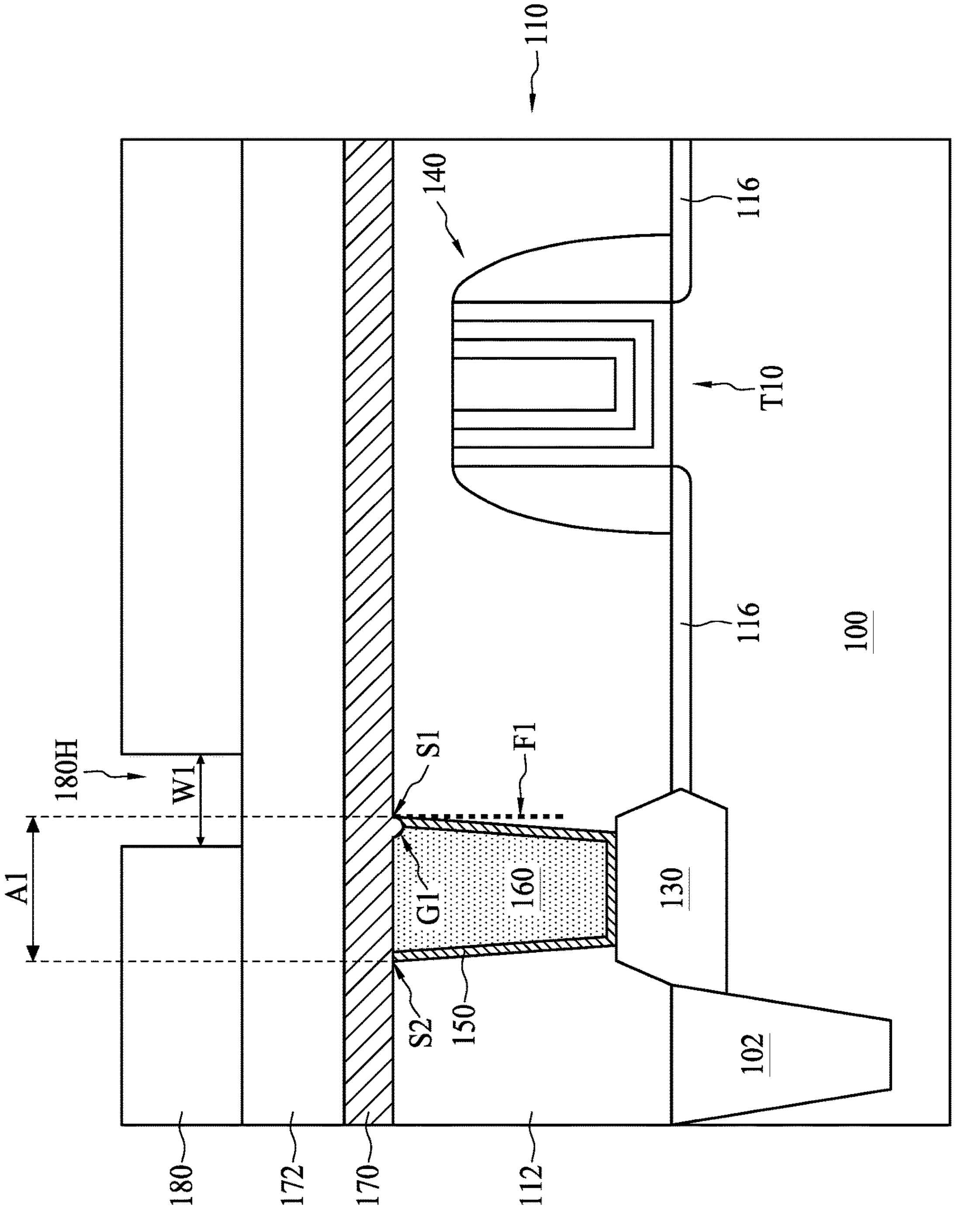

Referring to FIG. 13D, in some cases, the opening 180H may not be completely within the alignment range A1. Such condition is referred to as misalignment, which may cause a subsequently formed recess to have a small exposure area with the conductive contact 162. In some embodiments, if a horizontal departure of the opening 180H from the vertical extension of the top edge S1 or S2 is greater than 0.5 times a width W1 of the opening 180H, operation 313 (which will be described below) is performed on the ILD layer 172 and the ESL 170.

Figure 14A:
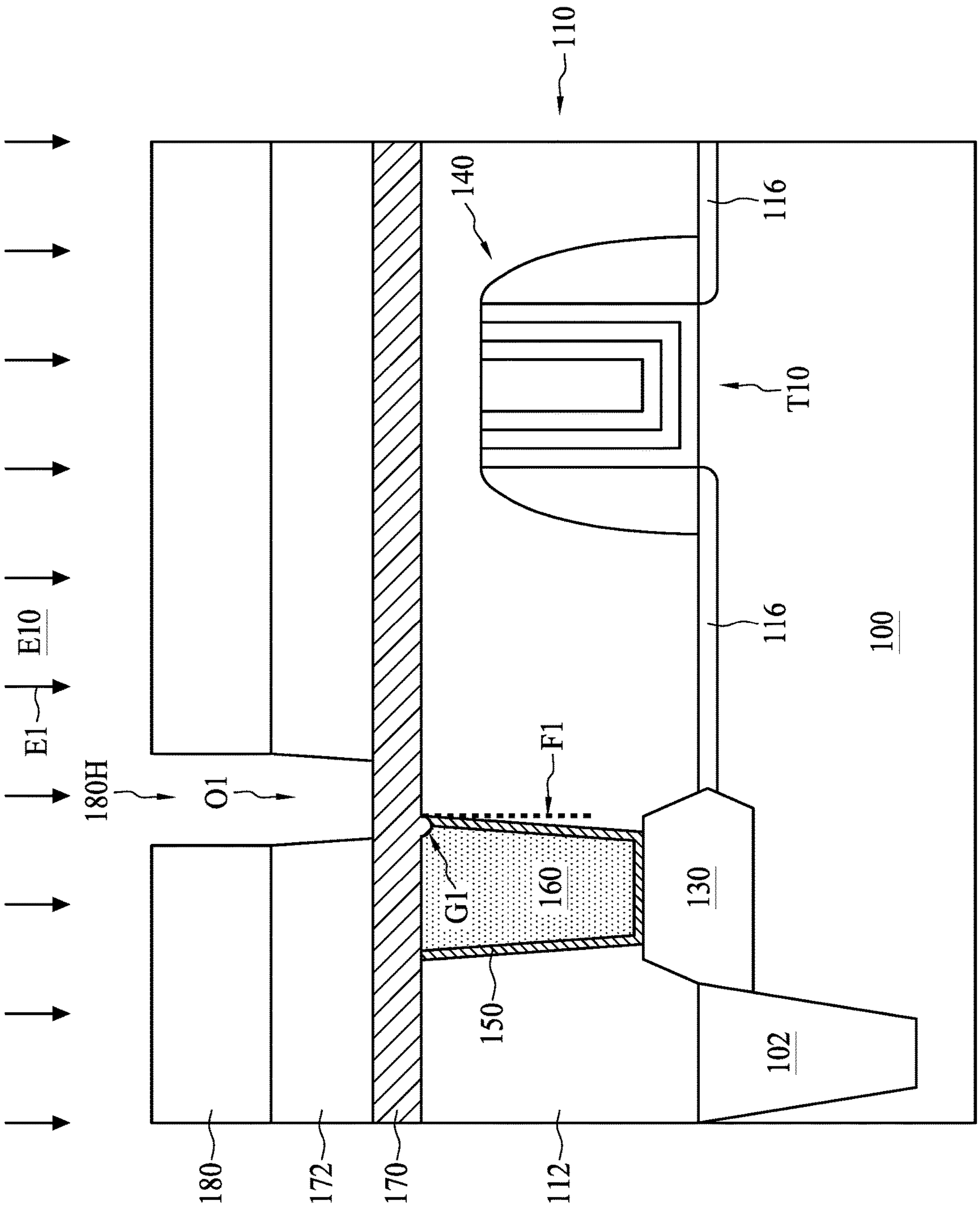
Figure 14B:
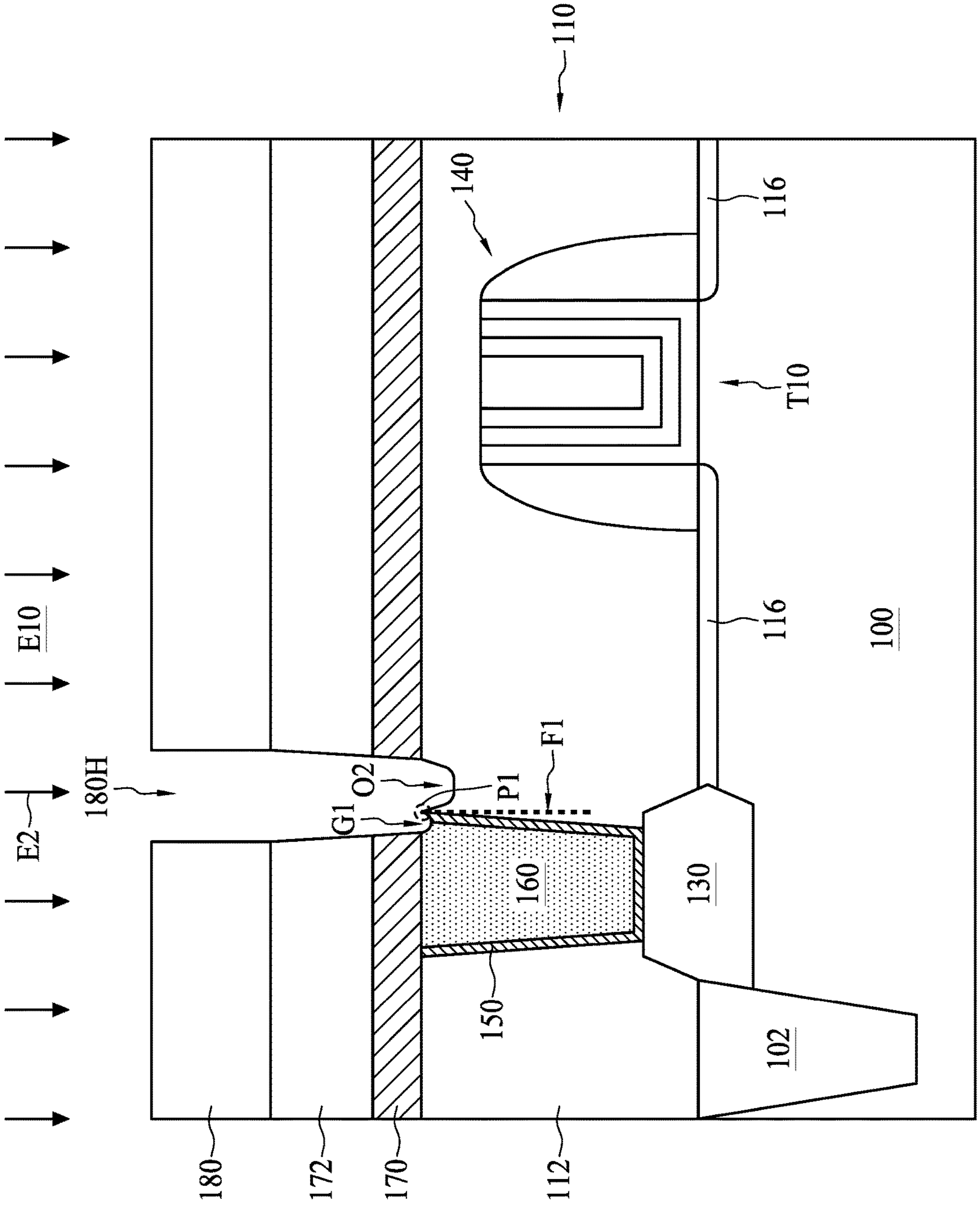

In operation 313 of FIG. 2, an etch operation E10 is performed on the ILD layer 172, the ESL 170 and the ILD layer 122 using the photoresist pattern 180 as an etch mask, as shown in FIGS. 14A and 14B. In some embodiments, the etch operation E10 includes two etch steps. The two etch steps may be performed in the same etch chamber or in different etch chambers.

Referring to FIG. 14A, an etchant E1 is used in a first etch step of the etch operation E10. In some embodiments, the etchant E1 is more reactive to the ILD layer 172 than to the ESL 170. That is, the ILD layer 172 may have a higher etch rate than that of the ESL 170 when the etchant E1 is used. In the first etch step of the etch operation E10, the etchant E1 passes through the opening 180H of the photoresist pattern 180 to react with the ILD layer 172. A portion of the ILD layer 172 is removed, thereby forming an opening O1 exposing a portion of a top surface of the ESL 170 in the ILD layer 172. In some embodiments, the opening O1 substantially is vertically over the interface F1 of the conductive contact 160 and the ILD layer 112.

Referring to FIG. 14B, an etchant E2 is used in a second etch step of the etch operation E10. In some embodiments, the etchant E2 has a low etch selectivity between the material of the ESL 170 and the material of the ILD layer 112. That is, the etchant E2 may be reactive to both the ESL 170 and the ILD layer 112. In the second etch step of the etch operation E10, the etchant E2 passes through the opening O1 of the ILD layer 172 to react with the ESL 170. A portion of the ESL 170 is removed such that the opening O1 is deepened and enlarged to extend to the ESL 170 until the top surface of the ILD layer 112 is exposed. The etchant E2 then passes through the ESL 170 to react with the ILD layer 112. In some embodiments, the second etch step of the etch operation E10 lasts for about 10 seconds to about 20 seconds.

After a top portion of the ILD layer 112 is removed, an opening O2 is formed in the ILD layer 112. The opening O2 may be communicated with the enlarged opening O1. The opening O2 and the enlarged opening O1 may be collectively referred to as the opening O2 for simplicity. In some embodiments, the ESL 170 filled in the groove G1 is also removed by the etchant E2, and thus the groove G1 is exposed again. In some embodiments, a protrusion P1 is formed between the groove G1 and the opening O2. In such embodiments, the protrusion P1 is substantially at the interface F1 of the conductive contact 160 and the ILD layer 112.

Figure 15A:
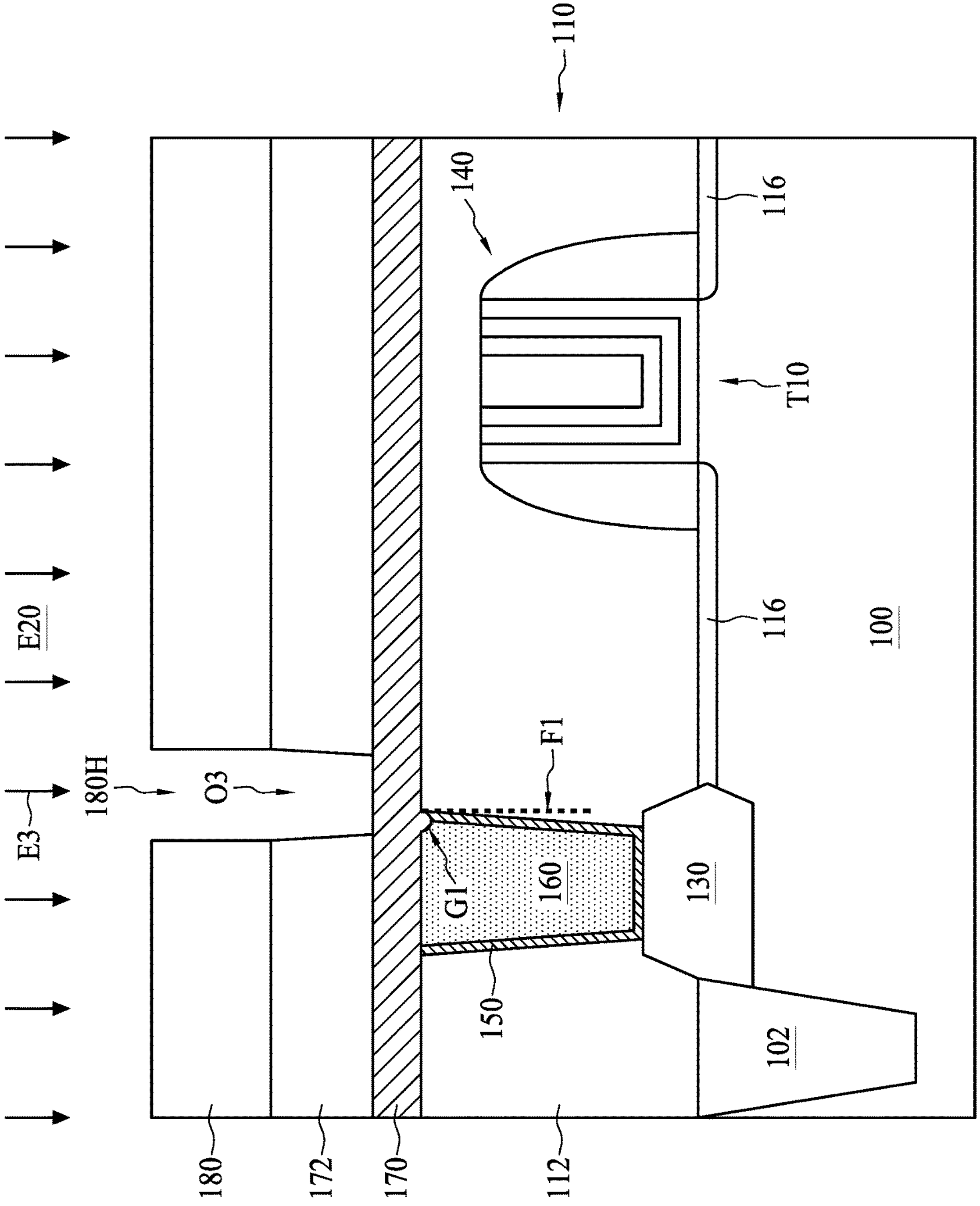
Figure 15B:
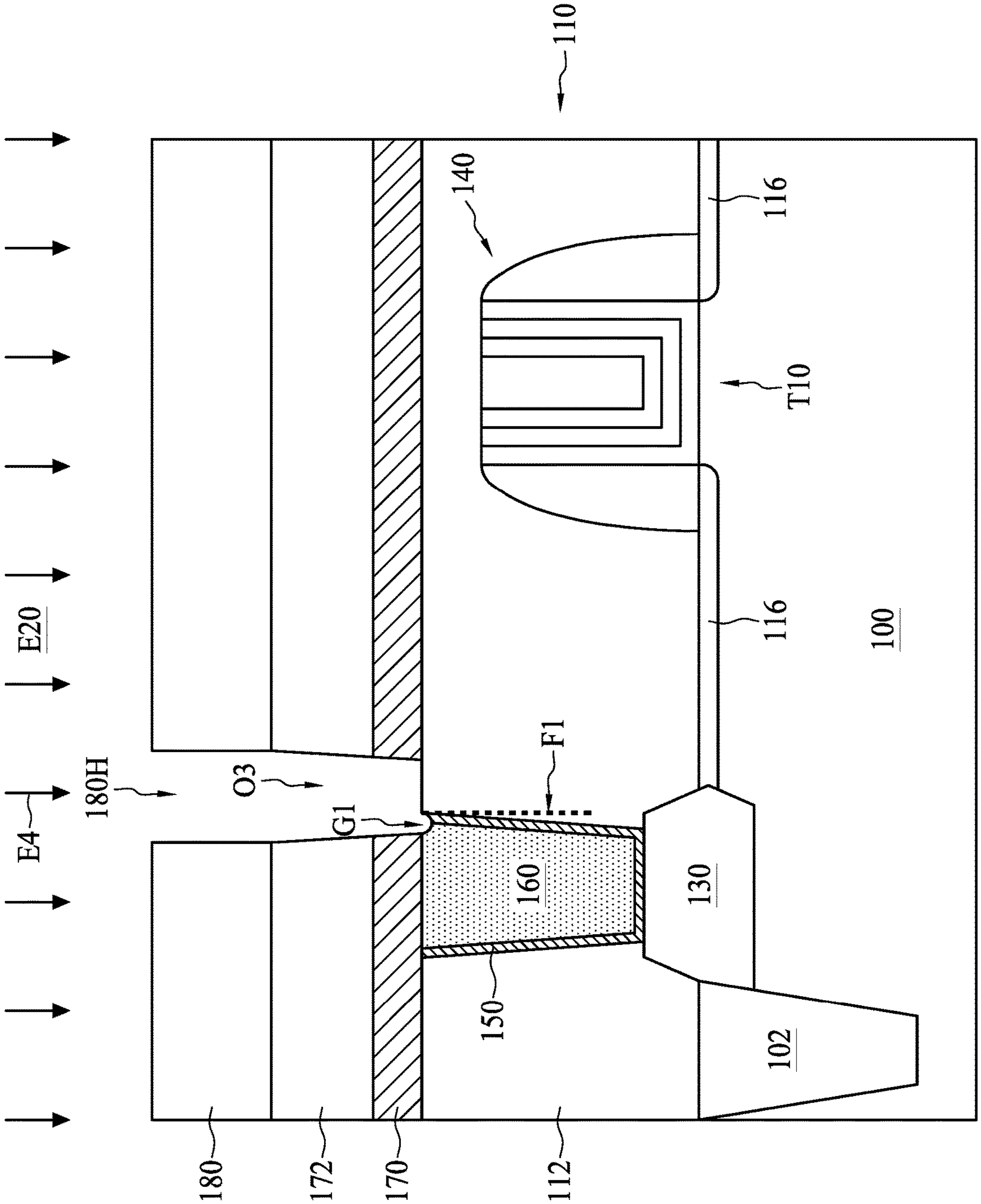
Figure 15C:
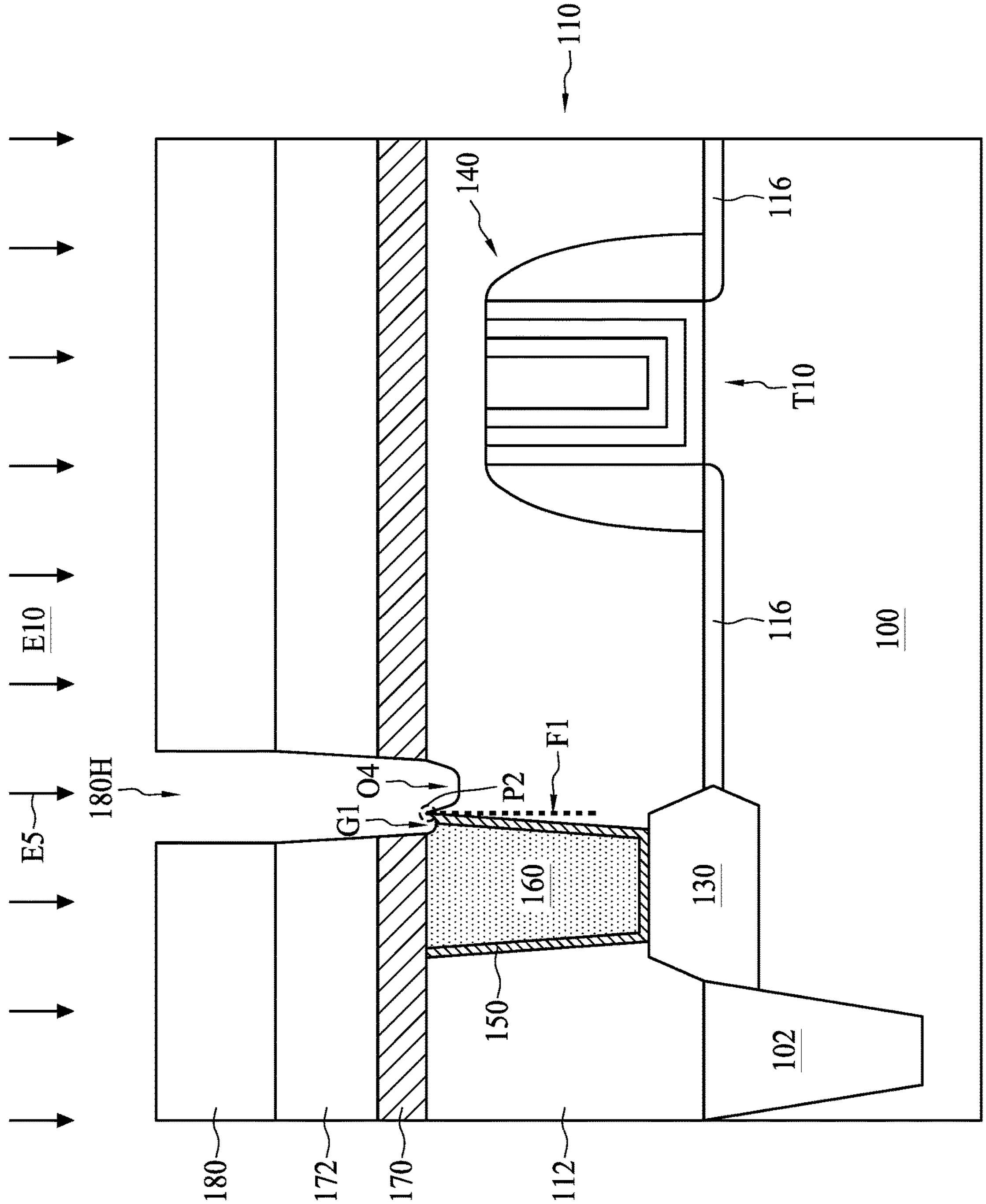

In other embodiments, in operation 313 of FIG. 2, an etch operation E20 is performed on the ILD layer 172, the ESL 170 and ILD layer 112 using the photoresist pattern 180 as an etch mask, as shown in FIGS. 15A to 15C. In some embodiments, the etch operation E20 includes three etch steps. The three etch steps may be performed in the same etch chamber or in different etch chambers.

Referring to FIG. 15A, an etchant E3 is used in a first etch step of the etch operation E20. The etchant E3 may be the same as or similar to the etchant E1. In some embodiments, the etchant E3 is more reactive to the ILD layer 172 than to the ESL 170. That is, the ILD layer 172 may have a higher etch rate than the ESL 170 when the etchant E3 is used. In the first etch step of the etch operation E20, the etchant E3 passes through the opening 180H of the photoresist pattern 180 to react with the ILD layer 172. A portion of the ILD layer 172 is removed, thereby forming an opening O3 exposing a portion of a top surface of the ESL 170 in the ILD layer 172. In some embodiments, the opening O3 is substantially vertically aligned with the interface F1 of the conductive contact 160 and the ILD layer 112.

Referring to FIG. 15B, an etchant E4 is used in a second etch step of the etch operation E20. In some embodiments, the etchant E4 is more reactive to the ESL 170 than to the ILD layer 172. That is, the ESL 170 may have a higher etch rate than that of the ILD layer 172 when the etchant E4 is used. In the second etch step of the etch operation E20, the etchant E4 passes through the opening O3 of the ILD layer 172 to react with the ESL 170. A portion of the ESL 170 is removed such that the opening O3 is deepened and enlarged to extend to the ESL 170 until the top surface of the ILD layer 112 is exposed. In some embodiments, the ESL 170 filled in the groove G1 is also removed by the etchant E4, and thus the groove G1 is exposed again.

Referring to FIG. 15C, an etchant E5 is used in the third etch step of the etch operation E20. The etchant E5 may be the same as or similar to the etchant E1 or E30. In some embodiments, the etchant E5 has a high etch selectivity between the material of the ESL 170 and the material of the ILD layer 112. The etchant E5 may pass through the opening O3 to react with the ILD layer 112. In some embodiments, the third etch step of the etch operation E20 lasts for about 8 seconds to about 12 seconds.

After a top portion of the ILD layer 112 is removed, an opening O4 is formed in the ILD layer 112. The opening O4 may be communicated with the enlarged opening O3. The opening O4 and the enlarged opening O3 may be collectively referred to as the opening O4 for simplicity. In some embodiments, a protrusion P2 is formed between the groove G1 and the opening O4. In such embodiments, the protrusion P2 is substantially at the interface F1 of the conductive contact 160 and the ILD layer 112.

Figure 16:
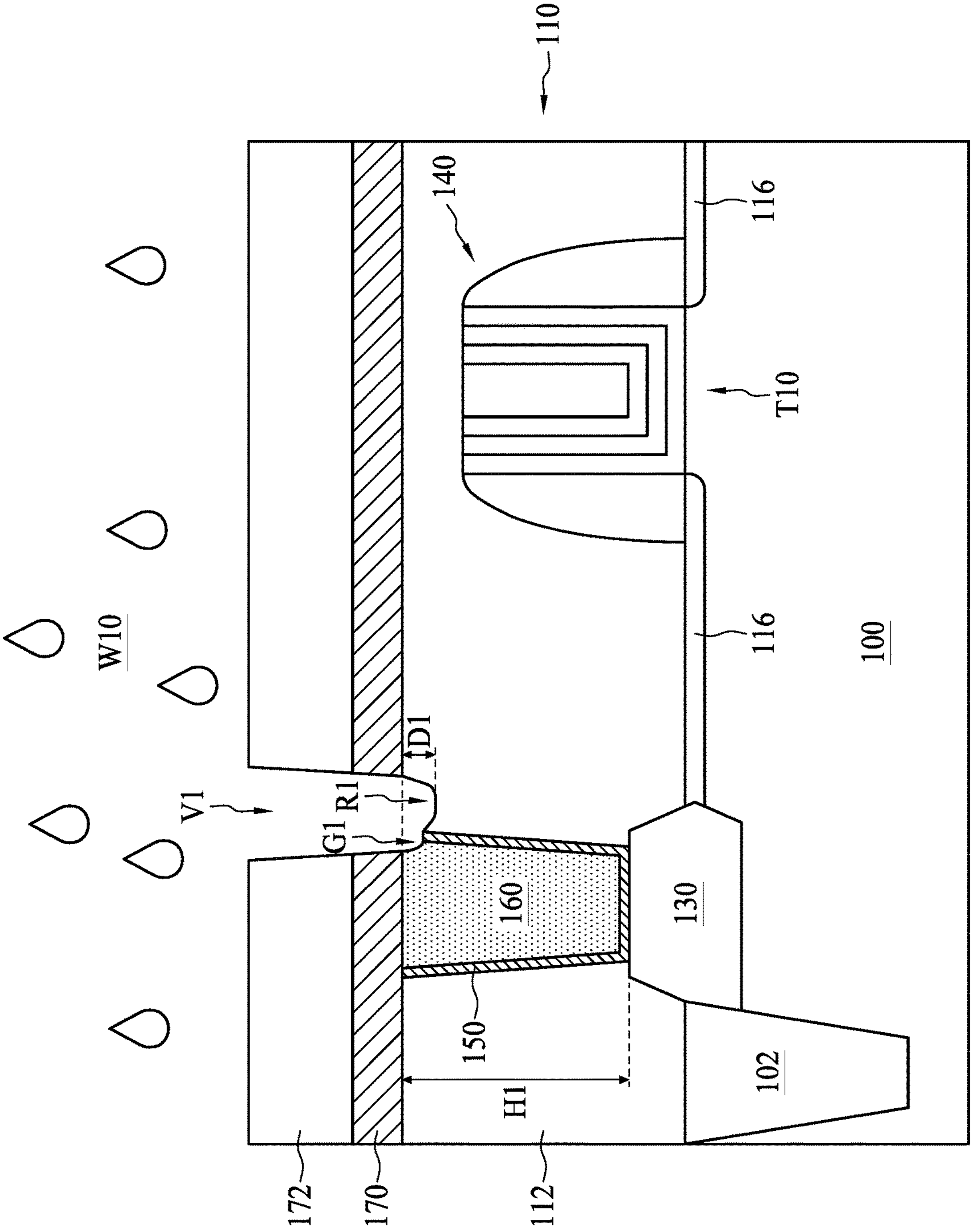

In operation 315 of FIG. 2, a wet clean operation W10 is performed on the photoresist pattern 180, as shown in FIG. 16. FIG. 16 may be continued from FIG. 14B or FIG. 15C. In some embodiments, the photoresist pattern 180 is removed by the wet clean operation W10. The wet clean operation W10 can also be used to remove post etch residues. In some embodiments, one or more reagents in the wet clean operation W10 react with the conductive contact 160. A portion of the conductive contact 160 may be consumed, thereby enlarging the groove G1. In some embodiments, one or more reagents in the wet clean operation W10 enter the opening O2 or O4 to react with the ILD layer 112. A portion of the ILD layer 112 may be removed, and the opening O2 or O4 is enlarged to form a recess R1. In some embodiments, the recess R1 in the ILD layer 112 has a depth D1 between one-third and one-second the height H1 of the conductive contact 160. Comparing FIGS. 14B and 16 or FIGS. 15C and 16, in some embodiments, the protrusion P1 or P2 is partially removed after the wet clean operation W10. Therefore, the recess R1 may be connected with the enlarged groove G1. The recess R1 and its connected groove G1 may be collectively referred to as the recess R1 for simplicity. In some embodiments, the recess R1 exposes a sidewall of the conductive contact 160. In some embodiments, an area of the conductive contact 160 exposed by the recess R1 is less an area of the ILD layer 112 exposed by the recess R1. The recess R1 may be connected with the enlarged opening O1 or O3 to form a contact hole V1.

Figure 17A:
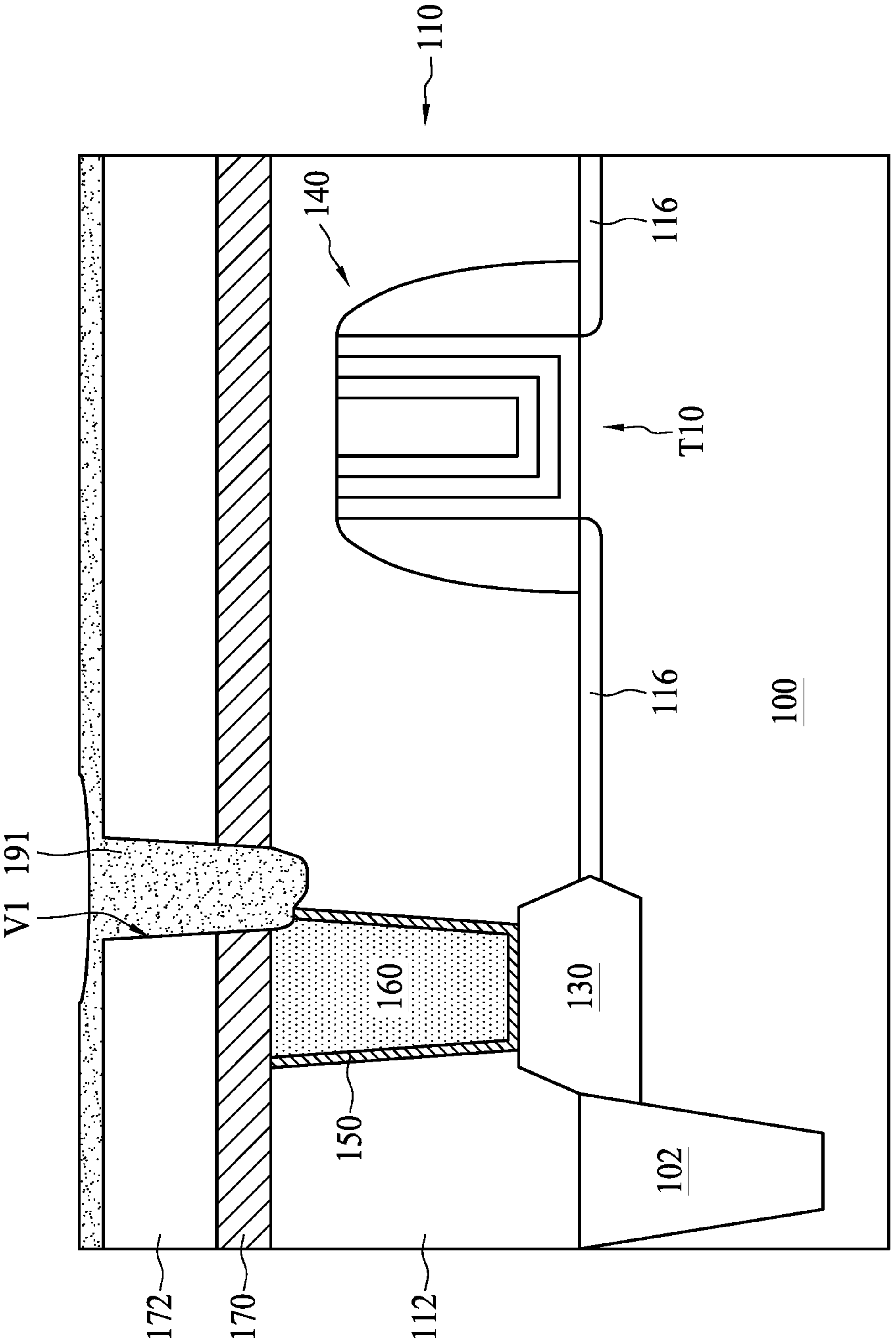
Figure 17B:
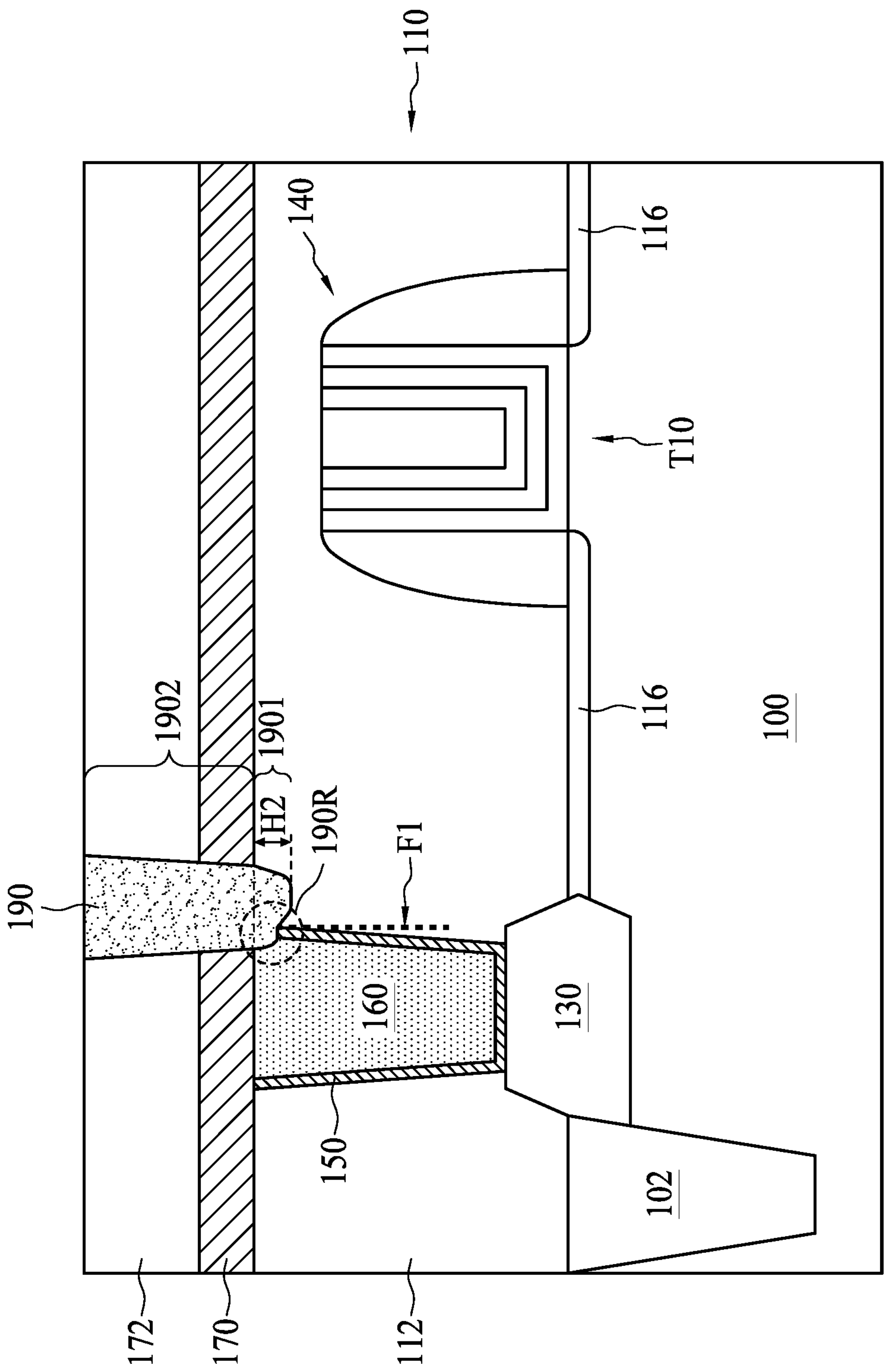

In operation 317 of FIG. 2, a conductive via 190 is formed over the conductive contact 160, as shown in FIGS. 17A and 17B. Referring to FIG. 17A, a conductive material 191, such as W, Cu, Co, Al, Ni, Ta, Ti, Mo, Pd, Pt, Ru, Ir, Ag, Au, the like, or a combination thereof, may be deposited into the contact hole V1 using sputtering, electroplating, PVD or other suitable methods. The conductive material 191 may completely cover the ILD layer 172. The conductive material 191 may at least contact a sidewall of the conductive contact 160. Although not specifically illustrated, a diffusion barrier layer similar to the diffusion barrier layer 150 may be conformally formed in the contact hole V1 prior to the deposition of the conductive material 191. At such time, the diffusion barrier layer in the contact hole V1 may at least contact the sidewall of the conductive contact 160.

Referring to FIG. 17B, a planarization operation, such as CMP, may be used to remove any excess conductive material 191 over the top surface of the ILD layer 172. The conductive material in the contact hole V1 and the ILD layer 172 are planarized to have a coplanar top surface. The remained conductive material in the contact hole V1 forms the conductive via 190. The conductive via 190 may be a via structure penetrating the ILD layer 172. In some embodiments, the conductive via 190 is disposed on the interface F1 of the conductive contact 160 and the ILD layer 112. The conductive via 190 may be in contact with a portion of the diffusion barrier layer 150. The conductive via 190 may be surrounded by the ILD layer 112, the ESL 170 and the ILD layer 172. In some embodiments, a contacting area between the conductive via 190 and the ILD layer 112 is greater than a contacting area between the conductive via 190 and the conductive contact 160.

The conductive via 190 may be referred to as a first type of via (i.e., VD) if the height (vertical length) of the conductive via 190 is greater than the width (horizontal length) of the conductive via 190. The conductive via 190 may be referred to as a second type of via (i.e., VDR) if the width of the conductive via 190 is approximately 2 to 3 times greater than the height of the conductive via 190. The VDR-type conductive via 190 may extend horizontally in the ILD layer 172 and connect one conductive contact 160 to an adjacent conductive contact 160 below the conductive via 190.

In some embodiments, the conductive via 190 formed over the conductive contact 160 and the ILD layer 112 is attached to the conductive contact 160 through a corner portion 190R of the conductive via 190. Such attachment may sometimes be referred to as an "anchoring attachment." The corner portion 190R of the conductive via 190 may sometimes be referred to as a "rivet" when the corner portion 190R is inserted to a predetermined depth of the conductive contact 160. The conductive via 190 is electrically coupled to the conductive contact 160. In some embodiments, the conductive via 190 includes a metal different from a metal of the conductive contact 160. In some embodiments, the conductive via 190 includes a first portion 1901 under the top surface of the ILD layer 112 and a second portion 1902 over the top surface of the ILD layer 112. In such embodiments, the first portion 1901 has a height H2 between about 7 nanometers (nm) and about 12 nm.

Figure 18:
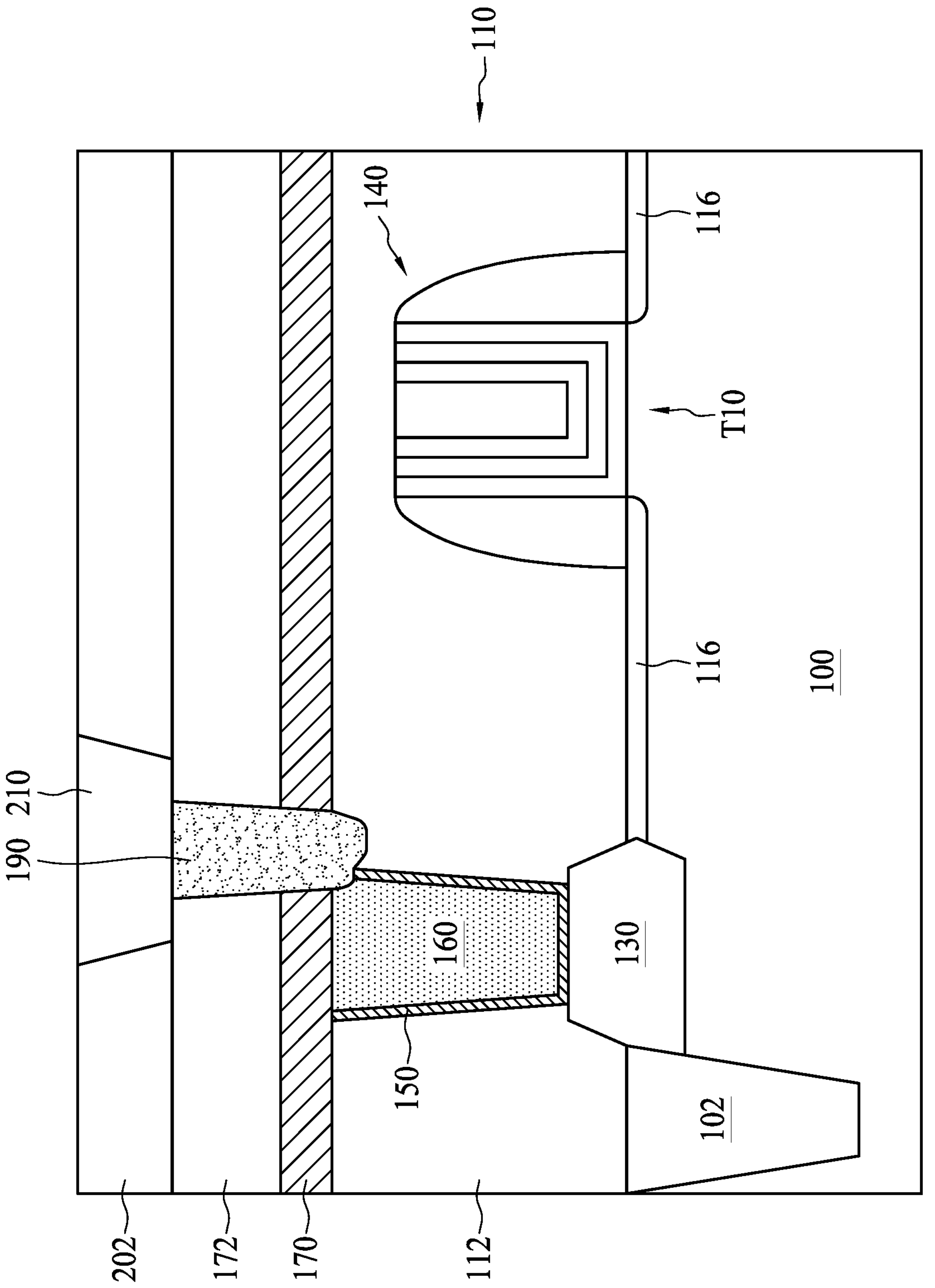
Figure 19:
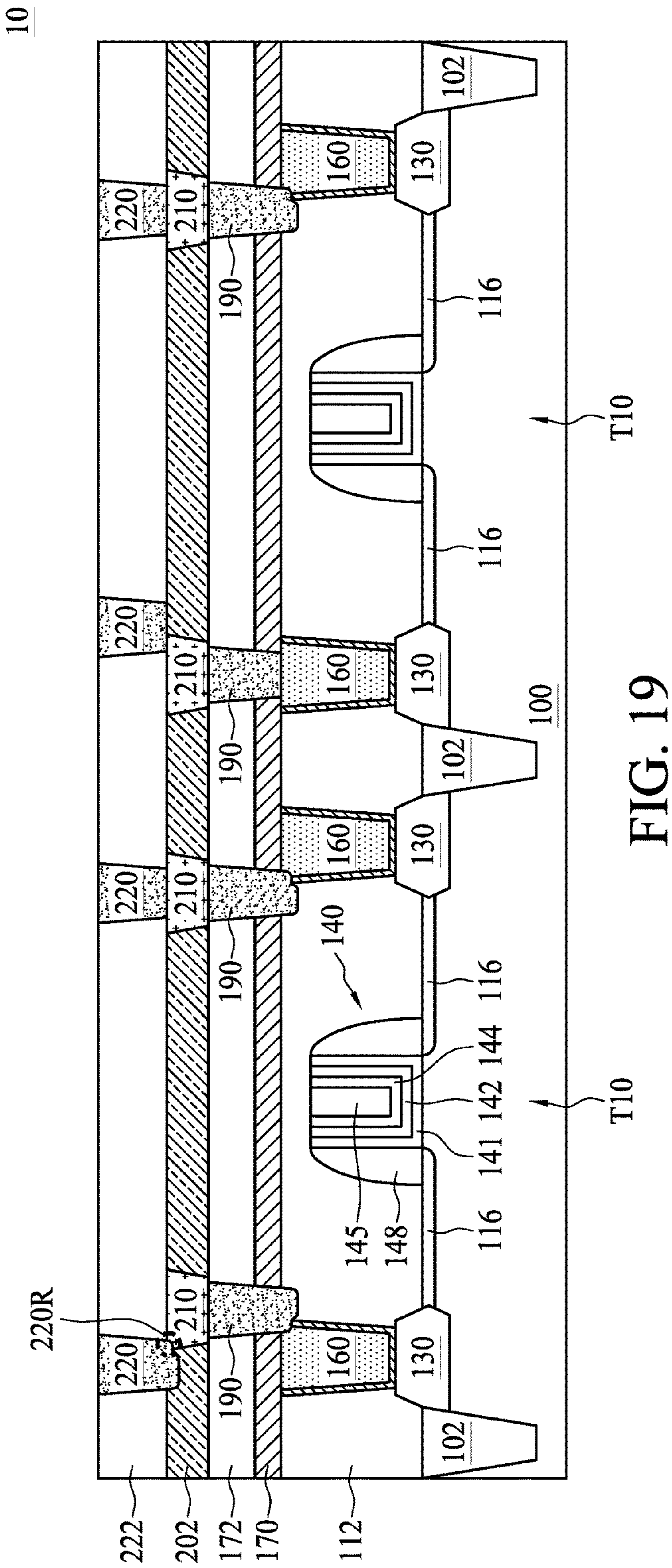

In operation 319 of FIG. 2, multiple conductive structures are formed over the conductive via 190, as shown in FIGS. 18 and 19. Referring to FIG. 18, a conductive layer 210 surrounded by an ILD layer 202 is formed on the conductive via 190 and the ILD layer 172. Although not specifically illustrated, the conductive layer 210 may be formed using a method similar to the method for forming the conductive via 190, and the ILD layer 202 may be formed using a method similar to the method for forming the ILD layer 172. The conductive layer 210 may be a metal line electrically coupled to the conductive via 190.

Referring to FIG. 19, a conductive layer 220 surrounded by an ILD layer 222 is formed on the conductive layer 210 and the ILD layer 202. Although not specifically illustrated, the conductive layer 220 may be formed using a method similar to the method for forming the conductive via 190, and the ILD layer 222 may be formed using a method similar to the method for forming the ILD layer 172. The conductive layer 220 may be a via structure electrically coupled to the conductive layer 210. The conductive layer 210 and the conductive layer 220 may be formed simultaneously using a single-damascene method or a dual-damascene method.

In some embodiments, the conductive layer 220 is vertically aligned with the conductive layer 210. In some embodiments, if the conductive layer 220 is not vertically aligned with the conductive layer 210, the conductive layer 220 is attached to the conductive layer 210 through a corner portion 220R of the conductive layer 220. A diffusion barrier layer (not shown) may be formed between the conductive via 190 and the ILD layer 172, between the conductive layer 210 and the ILD layer 202 or between the conductive layer 220 and the ILD layer 222. The diffusion barrier layer may be formed of TiN, TaN, Ta, Ti, TiSN, TaSN, W, WN, or combinations thereof, using ALD, PVD or other suitable methods. The diffusion barrier layer may be used to prevent a conductive material from diffusing into the ILD layers 172, 202 and 222. As a result, the formation of the semiconductor device 10 is complete.

Current photolithographic operations face several challenges. For example, unsatisfactory OVL alignments are a crucial issue. A photoresist pattern having a non-ideal OVL alignment may result in a poor landing of metal layers formed in subsequent operations. In order to reduce the rework rate of photoresist patterns and form acceptable etch holes, the present disclosure provides a method of forming more recess in an ILD layer proximal to a lower metal layer. The extra recess can be filled with more metals to form an upper metal layer connected with the lower metal layer. The upper metal layer at least contacts a sidewall of the lower metal layer. The upper metal layer can be electrically coupled to the lower metal layer through a corner portion of the upper metal layer. Therefore, although the photoresist pattern for forming the upper metal layer is not well aligned with the lower metal layer, a contacting area between the upper and lower metal layers is increased due to the extra filling of metals. The electrical resistance between the upper and lower metal layers will not be increased significantly, and the wafer acceptance test (WAT) fail rate can be reduced. The method of forming more recess in an ILD layer neighboring to a lower metal layer can be used to forming different transistors such as planar transistors, fin field-effect transistors FinFETs, GAA transistors or nanosheet transistors.

One aspect of the present disclosure provides a method for manufacturing a semiconductor device. The method includes: forming a first interlayer dielectric (ILD) layer and a metal layer in the first ILD layer; forming an etch stop layer (ESL) on the metal layer and the first ILD layer; forming a second ILD layer on the ESL; performing a first etch operation to remove a portion of the second ILD layer to form a first opening exposing a portion of the ESL, wherein the first opening is over an interface of the metal layer and the first ILD layer; performing a second etch operation to remove portions of the ESL and the first ILD layer through the first opening to form a second opening in the first ILD layer; and performing a wet clean operation on the second opening, wherein the wet clean operation removes a portion of the metal layer and enlarges the second opening to form a recess, and the recess exposes a sidewall of the metal layer.

One aspect of the present disclosure provides another method for manufacturing a semiconductor device. The method includes: forming a first metal structure in a first ILD layer; planarizing the first metal structure and the first ILD layer, wherein the planarizing generates a groove at an interface of the first metal structure and the first ILD layer; forming an etch stop layer (ESL) on the first metal structure and the first ILD layer; forming a second ILD layer on the ESL; performing a first etch operation to remove a portion of the second ILD layer to form a first opening; performing a second etch operation to remove a portion of the ESL through the opening; performing a third etch operation to remove a portion of the first ILD layer through the first opening to form a second opening in the first ILD layer; and enlarging the second opening to connected with the groove to form a contact hole.

Another aspect of the present disclosure provides a semiconductor device. The semiconductor devices includes: an interlayer dielectric (ILD) layer surrounding a transistor; a first via structure electrically coupled to the transistor; and a second via structure over the first via structure and the ILD layer, wherein a contacting area between the second via structure and the ILD layer is greater than a contacting area between the second via structure and the first via structure.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a first interlayer dielectric (ILD) layer and a metal layer in the first ILD layer;

planarizing the metal layer and the first ILD layer, wherein the planarizing generates a groove at an interface of the metal layer and the first ILD layer;

forming an etch stop layer (ESL) on the metal layer and the first ILD layer after the planarizing the metal layer and the first ILD layer;

forming a second ILD layer on the ESL;

performing a first etch operation to remove a portion of the second ILD layer to form a first opening exposing a portion of the ESL, wherein the first opening is over the interface of the metal layer and the first ILD layer;

performing a second etch operation to remove portions of the ESL and the first ILD layer through the first opening to form a second opening in the first ILD layer; and performing a wet clean operation on the second opening, wherein the wet clean operation removes a portion of the metal layer and enlarges the second opening to form a recess, and the recess exposes a sidewall of the metal layer.

2. The method of claim 1, wherein an area of the metal layer exposed by the recess is less an area of the first ILD layer exposed by the recess.

3. The method of claim 1, wherein an etchant used in the second etch operation has a low etch selectivity between a material of the ESL and a material of the first ILD layer.

4. The method of claim 1, wherein the second etch operation lasts for about 10 seconds to about 20 seconds.

5. The method of claim 1, wherein the groove is enlarged after the wet clean operation.

6. The method of claim 1, wherein after the wet clean operation, the groove is connected with the recess to form a contact hole.

7. The method of claim 6, further comprising filling a conductive material in the contact hole to form a via structure, wherein the via structure at least contacts the sidewall of the metal layer.

8. A method for manufacturing a semiconductor device, comprising:

receiving a substrate comprising a first ILD layer and a conductive contact in the first ILD layer;

forming an etch stop layer (ESL) over the first ILD layer and the conductive contact;

forming a second ILD layer on the ESL;

forming a patterned photoresist over the second ILD layer;

forming an opening in the ESL and the second ILD layer after the forming of the patterned photoresist, wherein a protrusion is formed at an interface of the conductive contact and the first ILD layer and exposed through the opening;

removing a portion of the conductive contact, a portion of the first ILD layer and the protrusion through the opening to form a hole, wherein the removal of the portion of the conductive contact, the portion of the first ILD layer and the protrusion further removes the patterned photoresist; and forming a conductive via in the hole.

9. The method of claim 8, wherein the forming of the opening comprises:

performing a first etch step to remove a portion of the second ILD layer to expose the ESL; and performing a second etch step to remove a portion of the ESL to expose the first ILD layer and to form protrusion at the interface of the conductive contact and the first ILD layer.

10. A method for manufacturing a semiconductor device, comprising:

receiving a substrate comprising a first dielectric layer surrounding at least one transistor;

forming a conductive contact in the first dielectric layer, wherein a groove is formed at an interface of the conductive contact and the first dielectric layer;

forming an ESL and a second dielectric layer over the first dielectric layer after the forming of the conductive contact and the groove;

using a first etchant to etch a portion of the second dielectric layer to form a first opening, wherein the first opening is over the interface of the conductive contact and the first dielectric layer;

using a second etchant to etch a portion of the ESL and a portion of the first dielectric layer through the first opening to expose the groove at the interface of the conductive contact and the first dielectric layer and a second opening in the first dielectric layer;

performing a wet clean operation to enlarge the second opening and the groove form a hole; and forming a conductive via in the hole.

11. The method of claim 10, wherein the conductive contact is coupled to the at least one transistor.

12. The method of claim 10, wherein the second groove is filled with the ESL.

13. The method of claim 10, further comprising forming a protrusion between the groove and the second opening.

14. The method of claim 13, further comprising a diffusion barrier layer disposed between the conductive contact and the first dielectric layer.

15. The method of claim 14, wherein the diffusion barrier layer forms the protrusion between the groove and the second opening.

16. The method of claim 13, wherein the protrusion is removed by the wet clean operation.

17. The method of claim 10, wherein a depth of the second opening is between one-third and one-second a height of the conductive contact after the wet clean operation.

18. The method of claim 10, further comprising forming a conductive layer over and coupled to the conductive via.

19. The method of claim 18, wherein the conductive layer is surrounded by a third dielectric layer.

20. The method of claim 10, wherein the second etchant has a low etch selectivity between a material of the ESL and a material of the first dielectric layer.

* * * * *